United States Patent
Kodani et al.

(10) Patent No.: US 8,458,900 B2
(45) Date of Patent: Jun. 11, 2013

(54) WIRING SUBSTRATE HAVING COLUMNAR PROTRUDING PART

(75) Inventors: Kotaro Kodani, Nagano (JP); Junichi Nakamura, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 359 days.

(21) Appl. No.: 12/755,555

(22) Filed: Apr. 7, 2010

(65) Prior Publication Data
US 2010/0263923 A1  Oct. 21, 2010

(30) Foreign Application Priority Data
Apr. 16, 2009 (JP) .................... 2009-099989

(51) Int. Cl.
*H05K 3/30* (2006.01)
*H01K 3/10* (2006.01)

(52) U.S. Cl.
USPC ............................................ 29/832; 29/852

(58) Field of Classification Search
USPC ..... 29/832, 825, 829, 847, 849, 852; 174/250
See application file for complete search history.

(56) References Cited

U.S. PATENT DOCUMENTS

| | | | | |
|---|---|---|---|---|
| 3,726,002 A | * | 4/1973 | Greenstein et al. | 29/832 |
| 4,240,198 A | * | 12/1980 | Alonso | 29/876 |
| 4,847,136 A | * | 7/1989 | Lo | 428/195.1 |
| 5,054,192 A | * | 10/1991 | Cray et al. | 29/835 |
| 5,229,647 A | * | 7/1993 | Gnadinger | 257/785 |
| 5,399,898 A | * | 3/1995 | Rostoker | 257/499 |
| 5,773,889 A | * | 6/1998 | Love et al. | 257/737 |
| 6,002,168 A | * | 12/1999 | Bellaar et al. | 257/696 |
| 6,054,772 A | * | 4/2000 | Mostafazadeh et al. | 257/781 |
| 6,057,600 A | * | 5/2000 | Kitazawa et al. | 257/728 |
| 6,229,209 B1 | * | 5/2001 | Nakamura et al. | 257/737 |
| 6,280,640 B1 | * | 8/2001 | Hurwitz et al. | 216/15 |
| 6,298,551 B1 | * | 10/2001 | Wojnarowski et al. | 29/829 |
| 6,300,685 B1 | * | 10/2001 | Hasegawa et al. | 257/780 |
| 6,329,713 B1 | * | 12/2001 | Farquhar et al. | 257/712 |

(Continued)

FOREIGN PATENT DOCUMENTS

| | | |
|---|---|---|
| JP | 2001-177010 | 6/2001 |
| JP | 2002-043506 | 2/2002 |
| JP | 2003-218286 | 7/2003 |
| JP | 2008-177619 | 7/2008 |

OTHER PUBLICATIONS

Office Action dated Aug. 7, 2012 issued with respect to the basic Japanese Patent Application No. 2009-099989.

*Primary Examiner* — David Angwin
(74) *Attorney, Agent, or Firm* — IPUSA, PLLC

(57) ABSTRACT

A method of making a wiring substrate having at least one interconnection layer includes forming a first metal layer on a surface of a support member having at least one columnar through hole that exposes the surface of the support member, forming a columnar metal layer that fills the columnar through hole, forming an insulating layer on the columnar metal layer and on the first metal layer, forming an interconnection layer on a first surface of the insulating layer electrically connected to the columnar metal layer through the insulating layer, and forming, by removing at least an entirety of the support member and an entirety of the first metal layer, a protruding part including at least part of the columnar metal layer protruding from a second surface of the insulating layer opposite the first surface, and serving as at least part of a connection terminal of the wiring substrate.

13 Claims, 42 Drawing Sheets

U.S. PATENT DOCUMENTS

| | | | |
|---|---|---|---|
| 6,372,547 B2 * | 4/2002 | Nakamura et al. | 438/118 |
| 6,406,942 B2 * | 6/2002 | Honda | 438/119 |
| 6,670,269 B2 * | 12/2003 | Mashino | 438/637 |
| 6,673,653 B2 * | 1/2004 | Pierce | 438/118 |
| 6,734,566 B2 * | 5/2004 | Honda | 257/778 |
| 6,809,421 B1 * | 10/2004 | Hayasaka et al. | 257/777 |
| 6,962,866 B2 * | 11/2005 | Ahn et al. | 438/622 |
| 6,969,905 B2 * | 11/2005 | Paulus | 257/666 |
| 6,984,886 B2 * | 1/2006 | Ahn et al. | 257/698 |
| 7,217,999 B1 * | 5/2007 | Honda | 257/712 |
| 7,683,470 B2 * | 3/2010 | Lee et al. | 257/687 |
| 7,928,001 B2 * | 4/2011 | Kurita et al. | 438/622 |
| 8,105,854 B2 * | 1/2012 | Lee et al. | 438/27 |
| 2001/0026021 A1 * | 10/2001 | Honda | 257/778 |
| 2002/0064935 A1 * | 5/2002 | Honda | 438/622 |
| 2002/0121689 A1 * | 9/2002 | Honda | 257/700 |
| 2005/0200028 A1 * | 9/2005 | Farnworth et al. | 257/774 |
| 2005/0269700 A1 * | 12/2005 | Farnworth et al. | 257/737 |
| 2009/0056998 A1 * | 3/2009 | Booth et al. | 174/262 |

* cited by examiner

WIRING SUBSTRATE HAVING COLUMNAR PROTRUDING PART

BACKGROUND OF THE INVENTION

1. Field of the Invention

The disclosures herein relate to a wiring substrate having a projection projecting from a surface of the wiring substrate, a semiconductor package having such a wiring substrate, and methods of making the wiring substrate and the semiconductor package.

2. Description of the Related Art

A semiconductor package having a semiconductor chip mounted on a wiring substrate via solder bumps or the like is known to those skilled in the art. For this type of semiconductor package, it is important to improve the reliability of connection between the wiring substrate and the semiconductor chip. In related-art semiconductor packages, metal layer portions are formed on a wiring substrate to protrude from a surface of the wiring substrate, and solder bumps are formed on these metal layer protruding portions for the purpose of improving the reliability of connection between the wiring substrate and the semiconductor chip. In the following, a description will be given of an example of a related-art wiring substrate on which metal layer portions projecting from a surface of the wiring substrate are formed.

FIG. 1 is a cross-sectional view illustrating an example of a related-art wiring substrate. In FIG. 1, a wiring substrate 100 includes a first insulating layer 130a, a second insulating layer 130b, a third insulating layer 130c, a first interconnection layer 140a, a second interconnection layer 140b, a protruding metal layer 160, and solder bumps 170.

In the wiring substrate 100, the first interconnection layer 140a formed in the first insulating layer 130a and the second interconnection layer 140b formed in the second insulating layer 130b are electrically connected to each other through first via holes 150a. The first insulating layer 130a is formed on a surface of the second insulating layer 130b and on the first interconnection layer 140a, and has openings 130x that expose part of the first interconnection layer 140a.

The third insulating layer 130c is formed on the other surface of the second insulating layer 130b to cover the second interconnection layer 140b. The protruding metal layer 160 is formed in openings 130y of the third insulating layer 130c to partly project from a surface 100a of the wiring substrate 100. The protruding metal layer 160 includes a Cu layer 161 and an Ni layer 162. The Cu layer 161 protrudes approximately 30 μm from the surface 100a of the wiring substrate 100. The Ni layer 162 having a thickness of approximately 5 μm is formed on the surface of the Cu layer 161. The Cu layer 161 and the second interconnection layer 140b are electrically connected to each other through second via holes 150b. The solder bumps 170 are formed on the protruding metal layer 160.

In the following, a method of making the wiring substrate 100 will be described. FIGS. 2 through 6 are drawings illustrating an example of a related-art method of making a wiring substrate. In FIGS. 2 through 6, the same elements as those of FIG. 1 are referred to by the same numerals, and a description thereof may be omitted.

In the process step illustrated in FIG. 2, a carrier metal (i.e., metal plate) 110 comprised of SUS (Stainless Used Steel) having a thickness of approximately 500 μm is provided. On a surface 110a of the carrier metal 110, an etching resist layer 120a having a predetermined pattern is formed, and openings 120x are formed through the photolithography method at positions corresponding to the positions where the protruding metal layer 160 is to be formed in the wiring substrate 100. Further, an etching resist layer 120b is formed to cover a back surface 110b of the carrier metal 110.

In the process step illustrated in FIG. 3, etching solution to dissolve SUS is sprayed to etch the exposed areas of the surface 110a of the carrier metal 110 in the openings 120x of the etching resist layer 120a. As a result, holes 110x having a depth of approximately 20 μm and having a substantially circular plan shape are formed in the surface 110a of the carrier metal 110.

In the process step illustrated in FIG. 4, a protruding metal layer 160a protruding beyond the surface 110a of the carrier metal 110 is formed in the holes 110x. Specifically, an Au electroplating process is performed to form an electrolytic Au plate, thereby forming an Au plate layer 163 having a thickness of approximately 0.5 μm on the inner wall surfaces of the openings 110x. An Ni electroplating process is then performed to form an electrolytic Ni plate, thereby forming an Ni plate layer 162 having a thickness of approximately 5 μm on the Au plate layer 163.

Further, a Cu electroplating process is performed to form a Cu layer 161 having a thickness (height) of approximately 30 μm on the Ni layer 162, thereby filling holes formed by the Ni layer 162 with the Cu layer 161. In this process step, it is preferable to use a Cu electrolytic plating solution for use in filled-via formation in order to readily fill the holes formed by the Ni layer 162. Through the three electroplating steps described above, the protruding metal layer 160a including the Cu layer 161, Ni layer 162, and Au layer 163 is formed. The protruding metal layer 160a has the Au layer 163 added to the protruding metal layer 160.

In the process step illustrated in FIG. 5, upon removal of the etching resist layer 120a and 120b illustrated in FIG. 4, a third insulating layer 130c having second via holes 150b and openings 130y at the positions of the protruding metal layer 160a is formed on the surface 110a of the carrier metal 110 and on the protruding metal layer 160a. Further, a second interconnection layer 140b electrically connected through the second via holes 150b to the Cu layer 161 of the protruding metal layer 160a is formed on the third insulating layer 130c.

After this, a second insulating layer 130b having the first via holes 150a is formed on the third insulating layer 130c to cover the second interconnection layer 140b. Moreover, a first interconnection layer 140a electrically connected through the first via holes 150a to the second interconnection layer 140b is formed on the second insulating layer 130b. Further, the first insulating layer 130a having openings 130x to expose part of the first interconnection layer 140a is formed on the second insulating layer 130b to partly cover the first interconnection layer 140a.

In the process step illustrated in FIG. 6, etching is performed to remove the entirety of the carrier metal 110 illustrated in FIG. 5, thereby exposing the entirety of the surface 100a of the wiring substrate 100 and the protruding metal layer 160a. After this, the solder bumps 170 are formed on the protruding metal layer 160a (see FIG. 1). In this process, the Au layer 163 would diffuse into the solder. In consideration of this, the solder bumps 170 are formed on the Ni layer 162 (i.e., on the protruding metal layer 160). In this manner, the wiring substrate 100 illustrated in FIG. 1 is manufactured.

The wiring substrate 100 has the protruding metal layer 160 protruding beyond the surface 100a of the wiring substrate 100 from inside the opening 130y of the third insulating layer 130c. The solder bumps 170 are formed on the protruding metal layer 160.

FIG. 7 is a cross-sectional view illustrating another example of a related-art wiring substrate. In FIG. 7, a wiring substrate 200 includes an etching stop layer 210b, a first interconnection layer 220, a CU layer 240, a second interconnection layer 250, an Ni layer 260, a first insulating layer 270, a second insulating layer 270a, a protruding metal layer 280, a reinforcement part 290, and solder bumps 300.

In the wiring substrate 200, the first interconnection layer 220 formed in the first insulating layer 270 and the second interconnection layer 250 formed in the second insulating layer 270a are electrically connected to each other through the CU layer 240 and the Ni layer 260. The etching stop layer 210b is formed on the first interconnection layer 220. The protruding metal layer 280 is formed on the etching stop layer 210b to project from a surface 200a of the wiring substrate 200. The solder bumps 280 are formed on the protruding metal layer 280. The second insulating layer 270a is formed on the first insulating layer 270 and on the second interconnection layer 250, and has openings 270x that expose part of the second interconnection layer 250.

In the following, a method of making the wiring substrate 200 will be described. FIGS. 8 through 12 are drawings illustrating another example of a related-art method of making a wiring substrate. In FIGS. 8 through 12, the same elements as those of FIG. 7 are referred to by the same numerals, and a description thereof may be omitted.

In the process step illustrated in FIG. 8, a metal substrate 210 having three layers is provided. The metal substrate 210 includes a metal layer 210a, the etching stop layer 210b, and a metal layer 210c. The metal substrate 210a is made of copper or copper alloy, and is formed in a film shape having a thickness of about 80 to 150 μm, for example. The etching stop layer 210b is made of a material having a sufficient etching selectivity ratio relative to copper or copper alloy when etching (e.g., etching using a hydrochloric-acid-based etching solution) is performed with respect to the copper or copper alloy. The metal layer 210c is a thin metal film made of copper stacked on the surface of the etching stop layer 210b. This metal layer 210c is to turn into the first interconnection layer 220.

In the process step illustrated in FIG. 9, the metal layer 210c of the metal substrate 210 having the three layer structure is patterned by photo-etching to form the first interconnection layer 220. A circuitry substrate 230 is then positioned relative to the metal substrate 210. The circuitry substrate 230 includes a metal layer 210d, the Ni layer 260, and the CU layer 240 stacked one over another in this order, with the first insulating layer 270 covering the surface thereof. It should be noted, however, the CU layer 240 is exposed through the first insulating layer 270. The metal layer 210d is to turn into the second interconnection layer 250.

In the process step illustrated in FIG. 10, the circuitry substrate 230 is stacked on the metal substrate 210. Specifically, the CU layer 240 of the circuitry substrate 230 is thermal-compression-bonded to the first interconnection layer 220 of the metal substrate 210 via the first insulating layer 270. At positions other than the positions of the CU layer 240, the circuitry substrate 230 and the metal substrate 210 are bonded to each other via the first insulating layer 270.

In the process step illustrated in FIG. 11, the metal layer 210d of the circuitry substrate 230 is patterned by photo-etching to form the second interconnection layer 250. The second insulating layer 270a is formed on the first insulating layer 270 and on the second interconnection layer 250, and has the openings 270x that expose part of the second interconnection layer 250. Ni plating or Au plating may be applied to the second interconnection layer 250 exposed through the opening 270x.

In the process step illustrated in FIG. 12, the metal layer 210a made of copper illustrated in FIG. 11 is selectively etched from the back side to form the protruding metal layer 280 and the reinforcement part 290. A solder film (e.g., 10-to-50-μm thick) 300 is an etching mask used for the selective etching, and is formed by plating. The solder film 300 may be patterned through selective removal by alkali etching using a resist layer or the like as a mask. The solder film 300 is then used as an etching mask in the etching process that forms the protruding metal layer 280 and the reinforcement part 290. A reflow process is then applied to the solder film 300 to form the solder bumps 300, thereby forming the wiring substrate 200 illustrated in FIG. 7.

As described above, the wiring substrate 200 has the protruding metal layer 280 protruding from the surface 200a of the wiring substrate 200. The solder bumps 300 are formed on the protruding metal layer 280.

A metal protruding layer formed on a related-art wiring substrate serves as a reliable connection terminal that has a sufficient height. While this is the case, it is difficult to maintain this reliability when shortening the interval between adjacent portions of the metal protruding layer. This problem will be described in the following by referring to the relevant drawings.

In FIG. 3 and the like, the holes 110x formed by etching the carrier metal 110 are illustrated as having a rectangular cross-sectional shape. It is known, however, that their actual cross-sectional shape is not a rectangle. FIG. 13 is a drawing illustrating an example of the actual shape of holes formed by etching. As illustrated in FIG. 13, the holes 110y formed by etching do not have a rectangular cross-section taken on a plane parallel to the XZ plane as do the holes 110x, but have a round cross-section.

Since etching advances not only in the Z direction but also in the X direction and in the Y direction, a maximum diameter $\phi_1$ of the holes 110y at the etching resist layer 120a is larger than a maximum diameter $\phi_2$ of the openings 120x, assuming that the openings 120x has a circular plan shape (as viewed in the Z direction). Further, the maximum diameter $\phi_1$ of the holes 110y increases as a maximum depth $D_1$ of the holes 110y increases. This gives rise to a problem especially when the pitch between the adjacent holes 110y shortens. This will be described by referring to FIG. 14.

FIG. 14 is a drawing illustrating an example of shortened pitches between adjacent holes illustrated in FIG. 13. As illustrated in FIG. 14, the shorter the pitch $P_1$ between adjacent holes 110y, the higher the risk of having the adjacent holes 110y coming in contact with each other. In order for the adjacent holes 110y not to come in contact with each other, the maximum depth $D_1$ may be required to be shallow. Because of this, it is difficult to provide the holes 110y formed by etching with a large aspect ratio ($D_1/\phi_1$). Since the protruding metal layer 160 is formed in the holes 110y, it is difficult to form the protruding metal layer 160 having a large aspect ratio.

Further, the protruding metal layer 280 of the wiring substrate 200 is formed by etching as are the holes 110x of the wiring substrate 100, so that its cross-sectional shape is not rectangular as illustrated in FIG. 7 and the like. As illustrated in FIG. 7 and the like, the diameter of the top end surface of the protruding metal layer 280 is smaller than the diameter of its bottom surface on the etching stop layer 210b. Accordingly, an attempt to increase the area size of the top end surface of the protruding metal layer 280 for the purpose of improving the reliability of connection may increase the risk of having the adjacent portions of the protruding metal layer 280 coming in contact with each other. In order for the adjacent portions of the protruding metal layer 280 not to come in contact with each other, the height of the protruding metal layer 280 may be required to be small. Because of this, it is difficult to provide each piece of the protruding metal layer 280 formed by etching with a large aspect ratio.

As described above, the related-art methods of manufacturing a wiring substrate use an etching process to form a protruding metal layer, which prevents the cross-sectional shape of the protruding metal layer from being a rectangular shape, thereby failing to provide a large aspect ratio. As a result, pitches between adjacent portions of the protruding metal layer cannot be shortened while ensuring that the protruding metal layer serves as reliable connection terminals having a sufficient height. Conversely, if pitches between adjacent portions of the protruding metal layer are to be shortened, the height of the protruding metal layer needs to be lowered, which results in the reliability of connection being reduced.

[Patent Document 1] Japanese Patent Application Publication No. 2003-218286
[Patent Document 2] Japanese Patent Application Publication No. 2002-43506
[Patent Document 3] Japanese Patent Application Publication No. 2001-177010

SUMMARY OF THE INVENTION

It may be preferable to provide a wiring substrate, a semiconductor package having the wiring substrate, and methods of making the wiring substrate and the semiconductor package, wherein the wiring substrate has connection terminals that have high connection reliability and that are suitable for use in a narrow-pitch arrangement.

According to an embodiment, a method of making a wiring substrate includes a first metal layer forming step of forming a first metal layer on a surface of a support member, the first metal layer having at least one columnar through hole that exposes the surface of the support member, a columnar metal layer forming step of forming a columnar metal layer that fills the columnar through hole, an insulating layer forming step of forming an insulating layer on the columnar metal layer and on the first metal layer, an interconnection layer forming step of forming an interconnection layer on a first surface of the insulating layer such that the interconnection layer is electrically connected to the columnar metal layer through the insulating layer, and a protruding part forming step of forming a protruding part including at least part of the columnar metal layer by removing at least the support member and the first metal layer, the protruding part protruding from a second surface of the insulating layer opposite the first surface and serving as at least part of a connection terminal of the wiring substrate.

According to another embodiment, a method of making a semiconductor package includes providing the wiring substrate having the protruding part made by the above-described method and a semiconductor chip having at least one electrode pad; arranging the semiconductor chip on the wiring substrate such that the electrode pad faces the protruding part; and electrically connecting the protruding part to the electrode pad.

According to another embodiment, a wiring substrate includes an insulating layer; an interconnection layer formed on a first surface of the insulating layer; and a columnar protruding part protruding from a second surface of the insulating layer opposite the first surface, the columnar protruding part electrically connected to the interconnection layer.

According to another embodiment, a semiconductor package includes the wiring substrate as described above; and a semiconductor chip having at least one electrode pad, wherein the protruding part and the electrode pad are electrically connected to each other.

According to at least one embodiment, a wiring substrate, a semiconductor package having the wiring substrate, and methods of making the wiring substrate and the semiconductor package are provided wherein the wiring substrate has connection terminals that have high connection reliability and that are suitable for use in a narrow-pitch arrangement.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments will be described by referring to the accompanying drawings.

First Embodiment

The first embodiment is directed to an example of a wiring substrate having a multilayer interconnection structure (i.e., having buildup interconnection layers).

Structure of Wiring Substrate of First Embodiment

Figure 1:
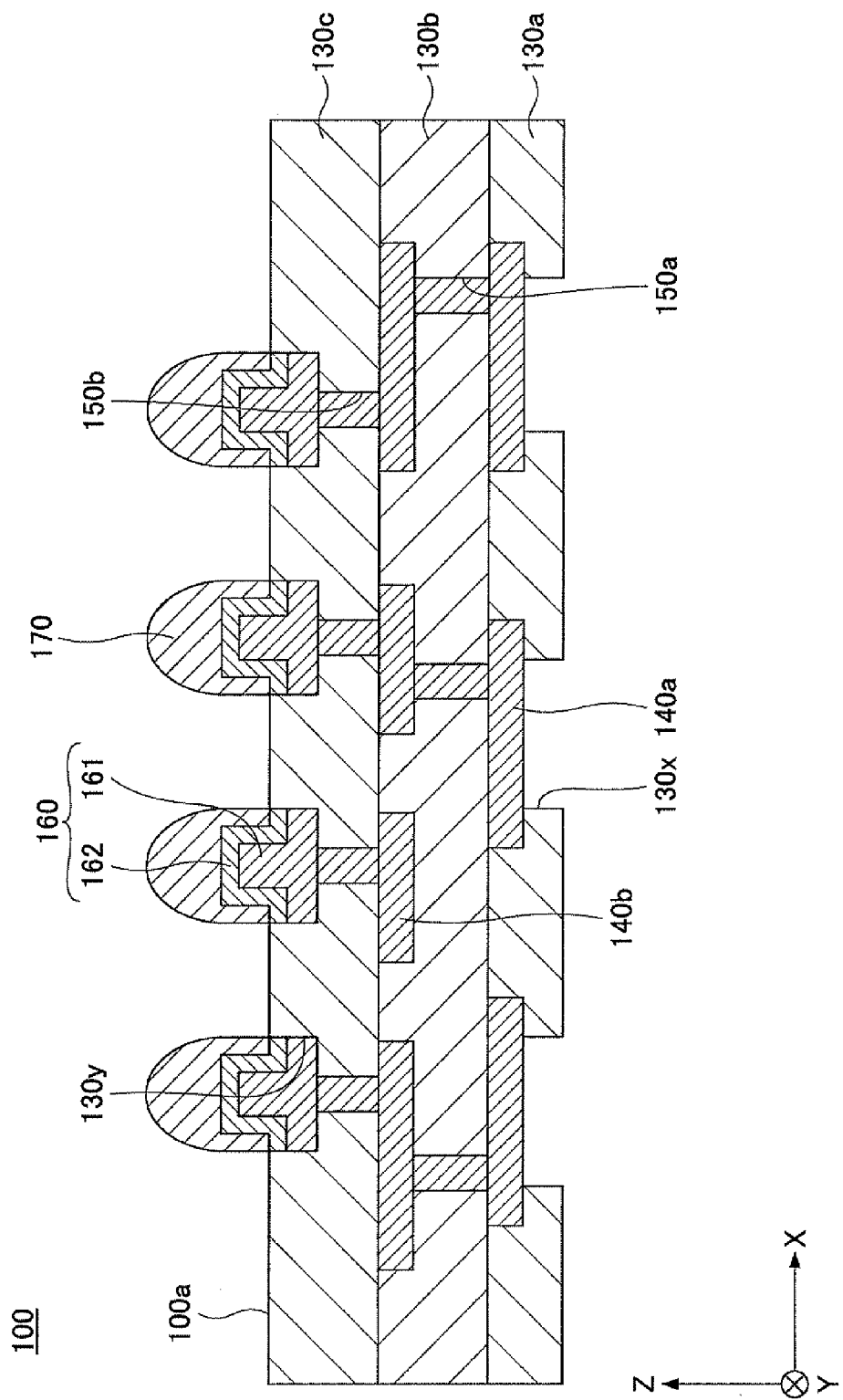
FIG. 1 is a cross-sectional view illustrating an example of a related-art wiring substrate.
Figure 2:
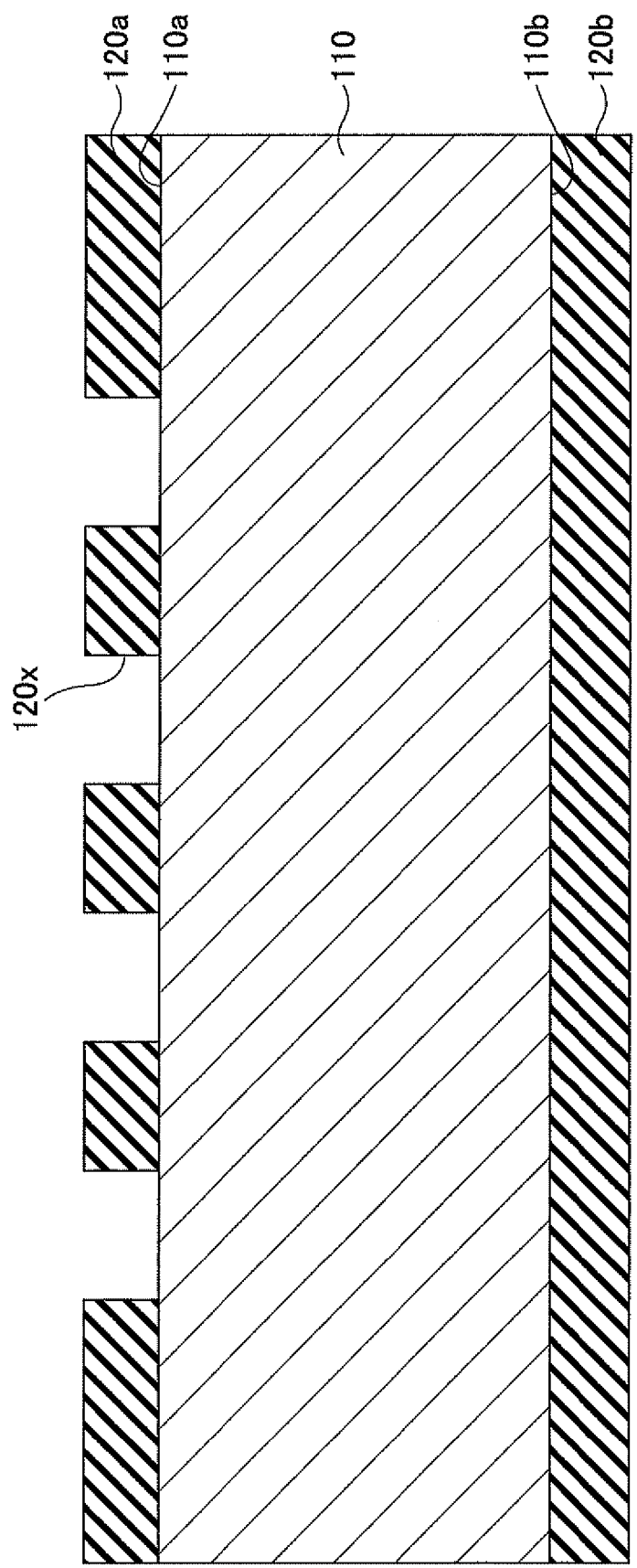
FIG. 2 is a drawing (part 1) illustrating a process step of making the related-art wiring substrate.
Figure 3:
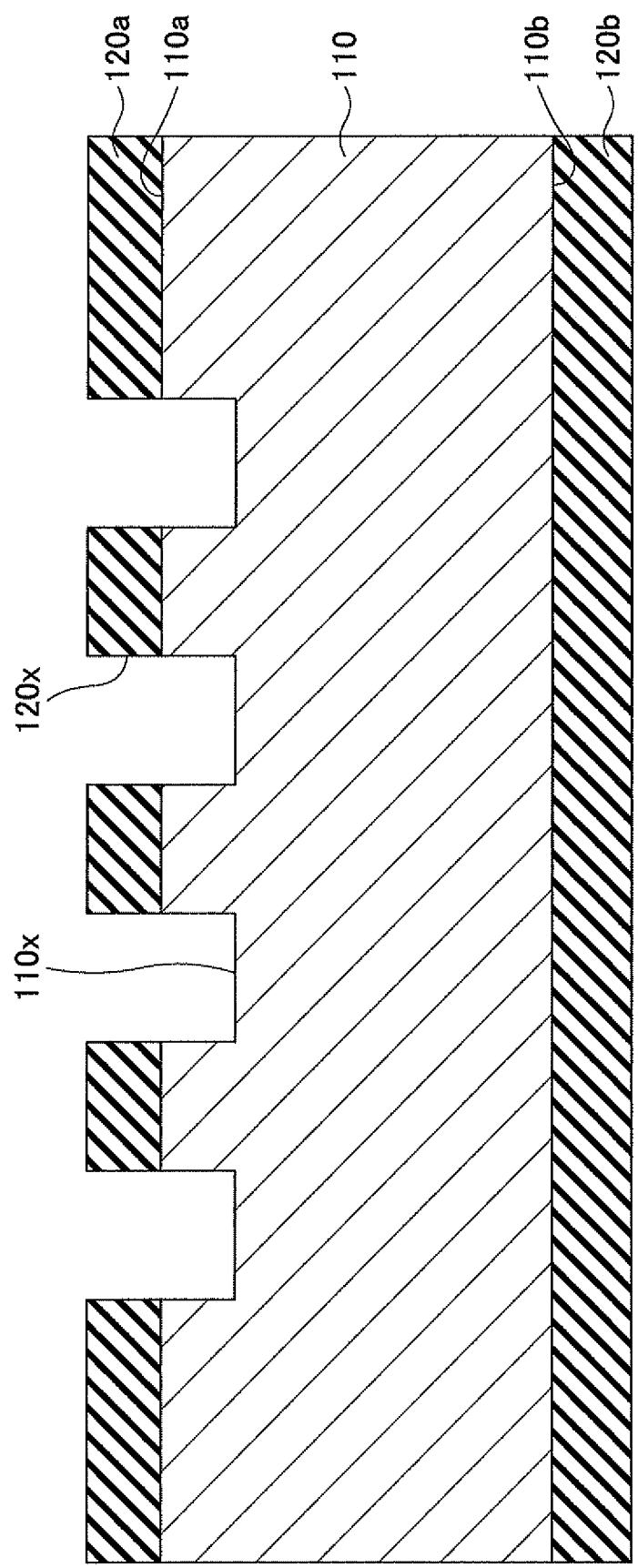
FIG. 3 is a drawing (part 2) illustrating a process step of making the related-art wiring substrate.
Figure 4:
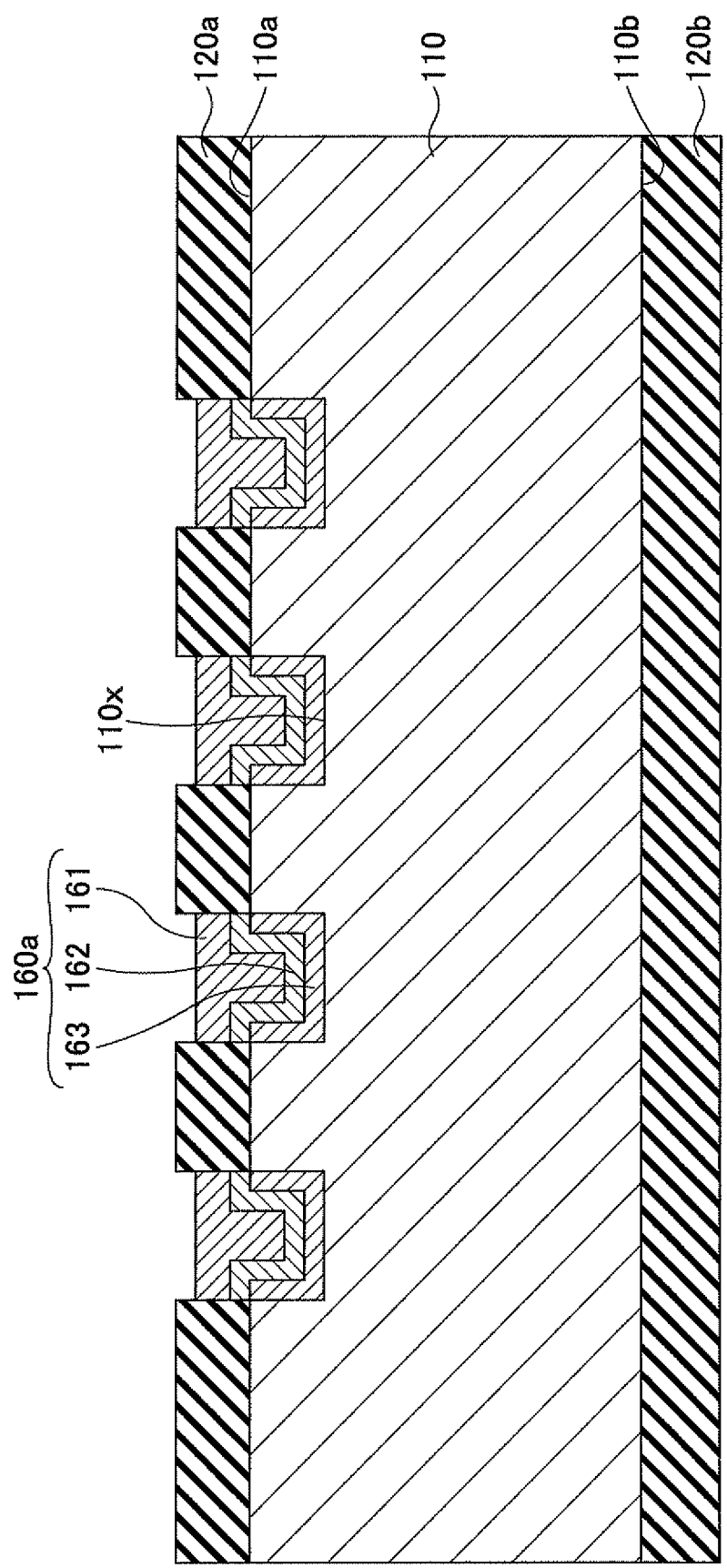
FIG. 4 is a drawing (part 3) illustrating a process step of making the related-art wiring substrate.
Figure 5:
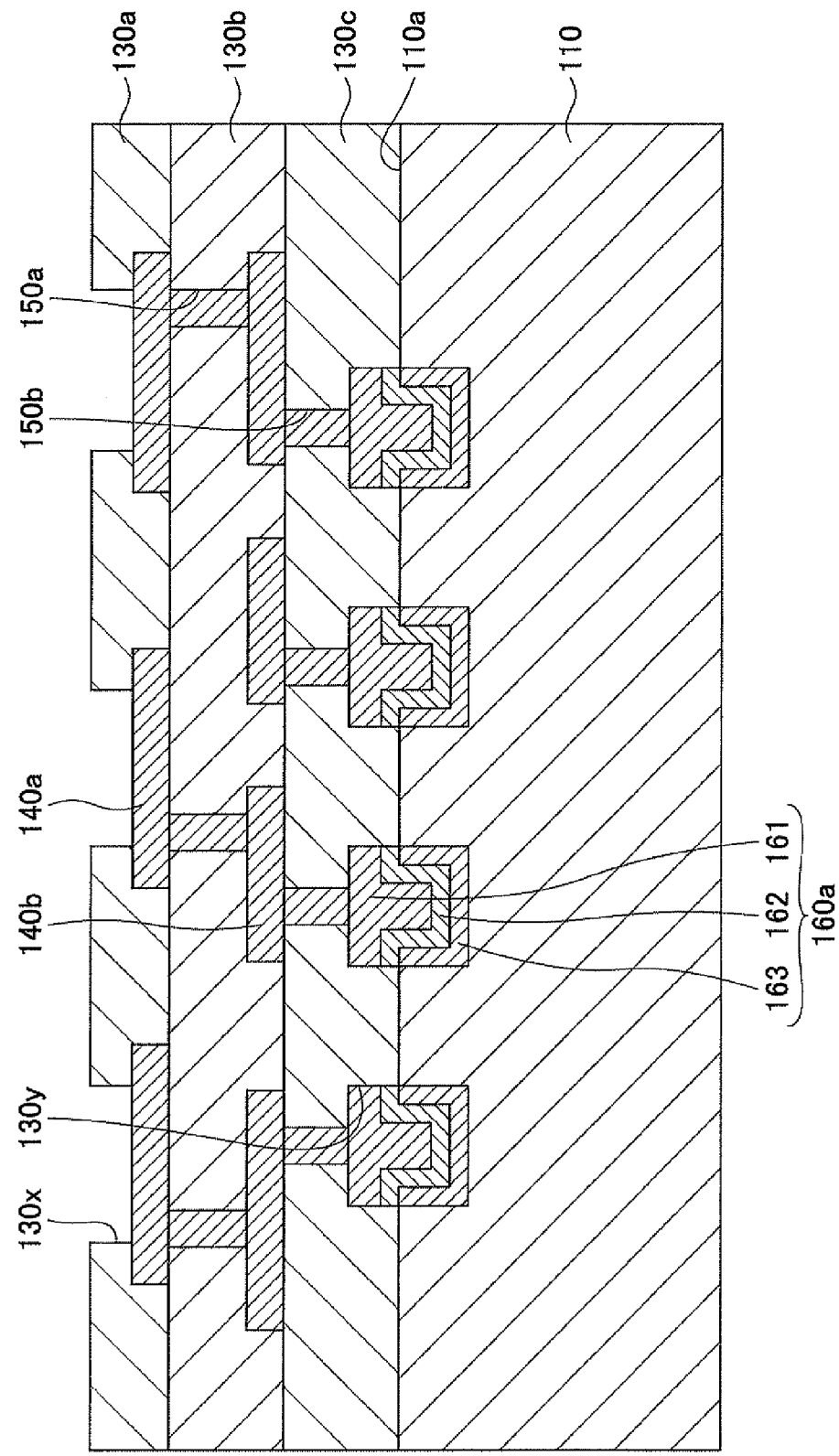
FIG. 5 is a drawing (part 4) illustrating a process step of making the related-art wiring substrate.
Figure 6:
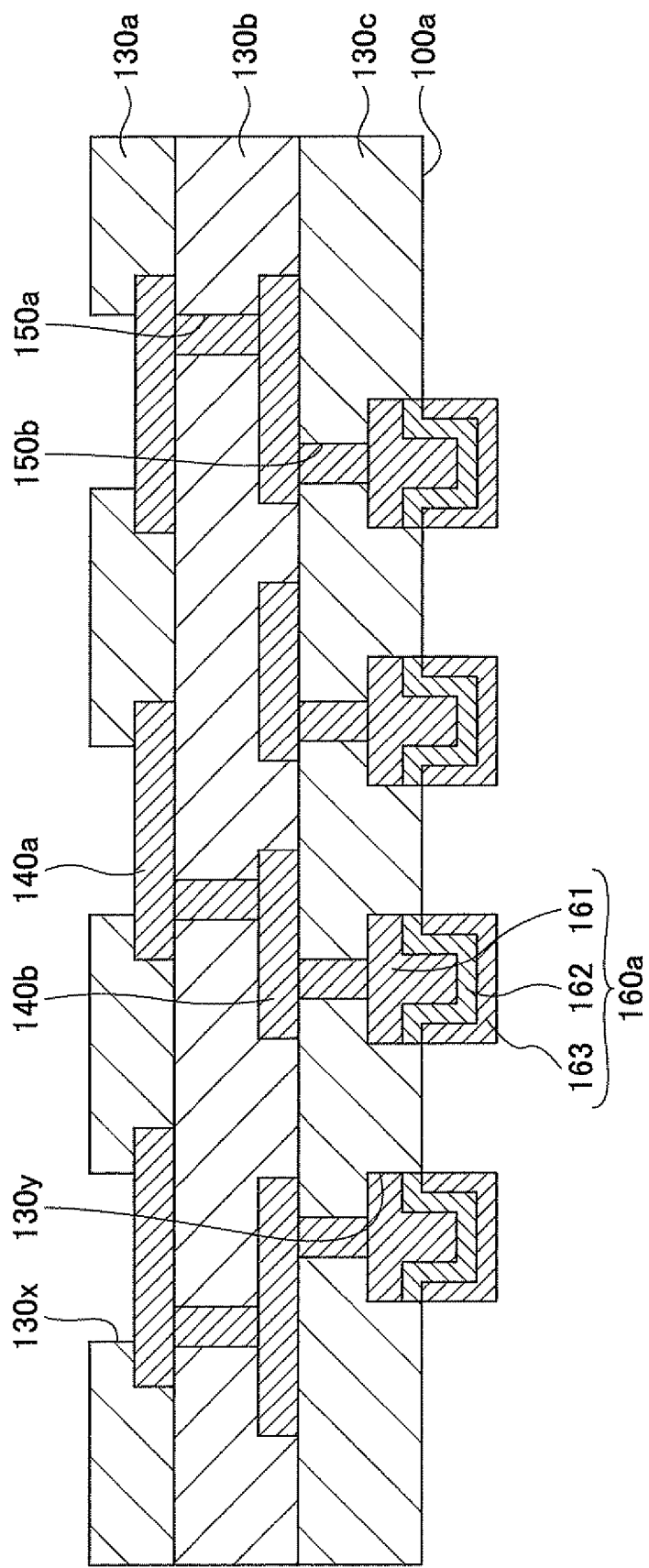
FIG. 6 is a drawing (part 5) illustrating a process step of making the related-art wiring substrate.
Figure 7:
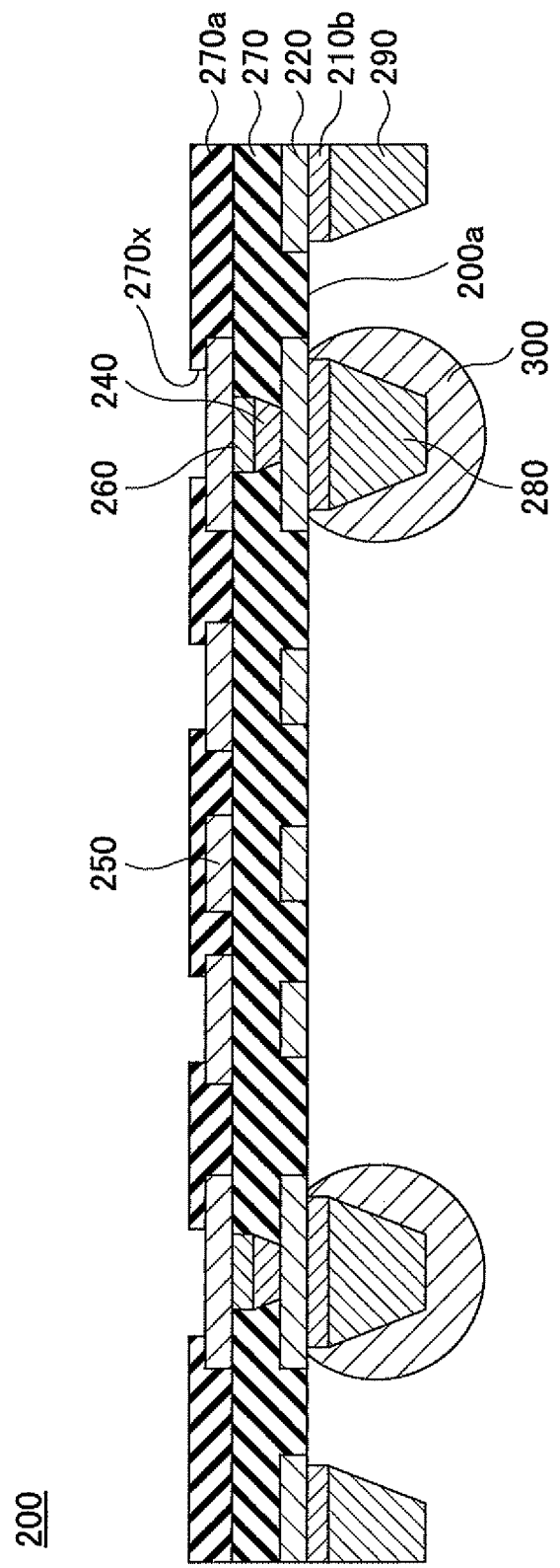
FIG. 7 is a cross-sectional view illustrating another example of a related-art wiring substrate.
Figure 8:
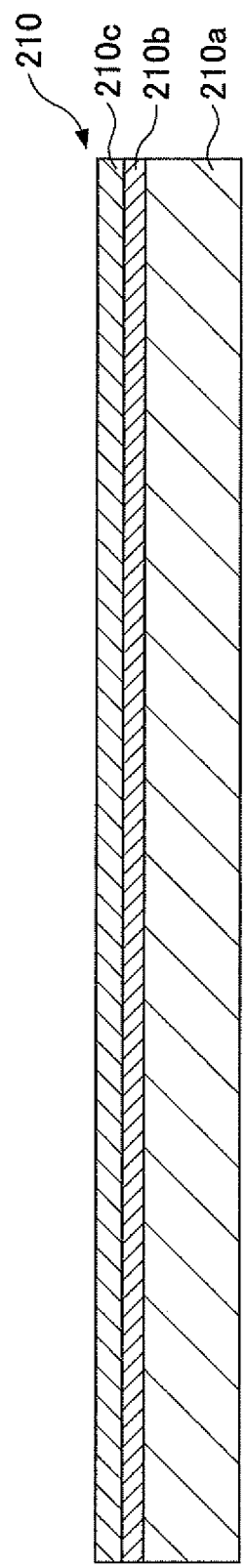
FIG. 8 is a drawing (part 1) illustrating another example of a process step of making the related-art wiring substrate.
Figure 9:
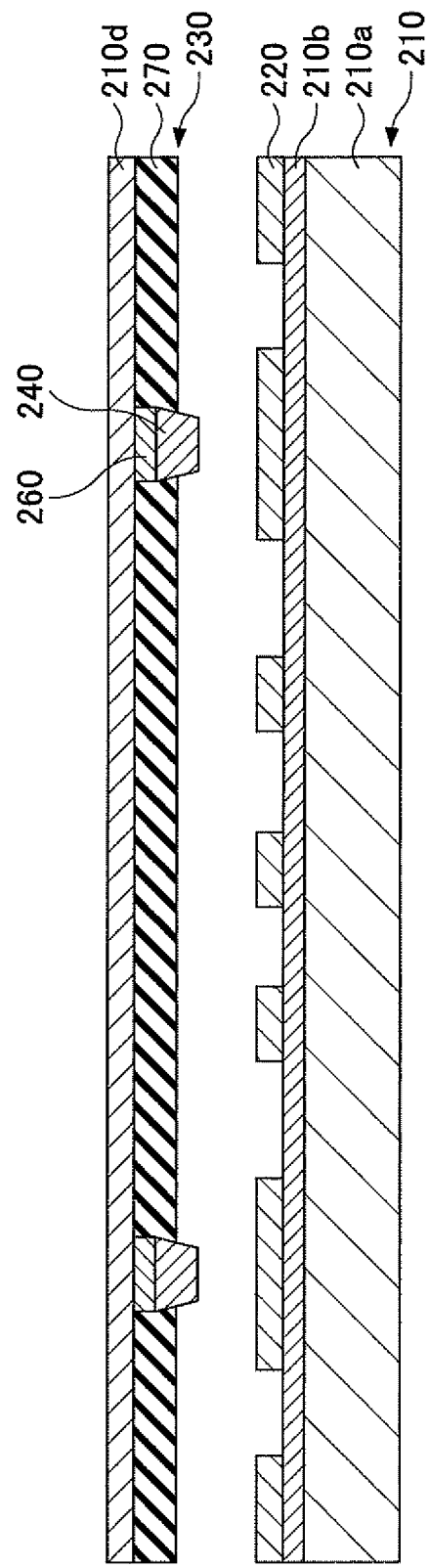
FIG. 9 is a drawing (part 2) illustrating another example of a process step of making the related-art wiring substrate.
Figure 10:
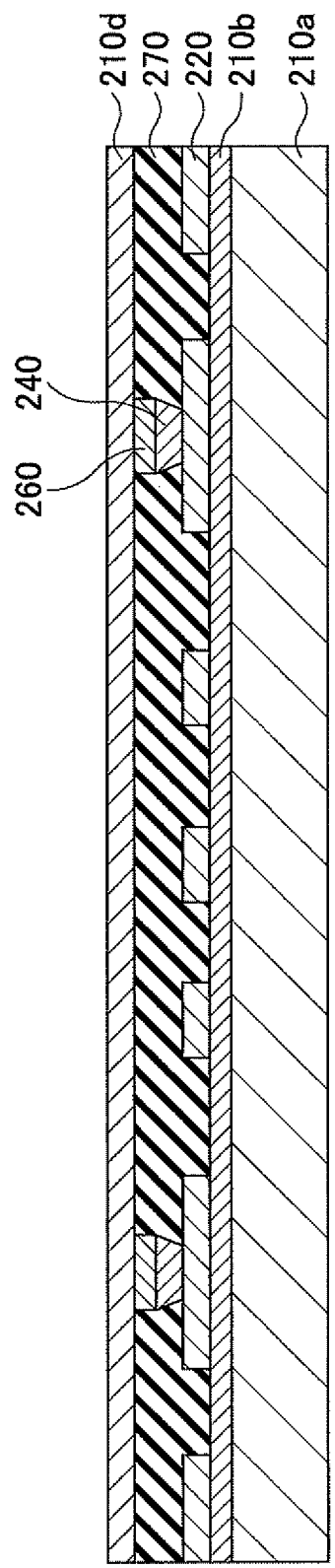
FIG. 10 is a drawing (part 3) illustrating another example of a process step of making the related-art wiring substrate.
Figure 11:
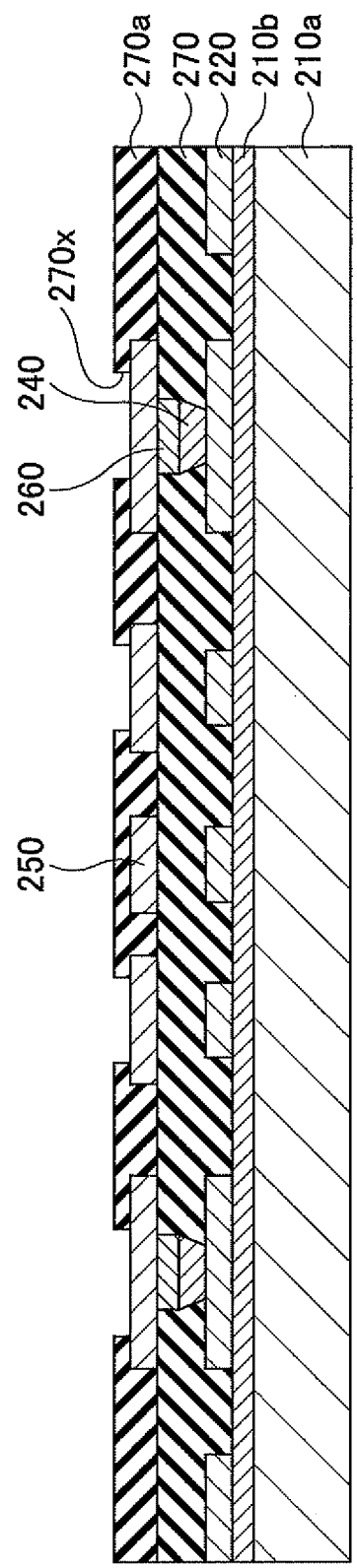
FIG. 11 is a drawing (part 4) illustrating another example of a process step of making the related-art wiring substrate.
Figure 12:
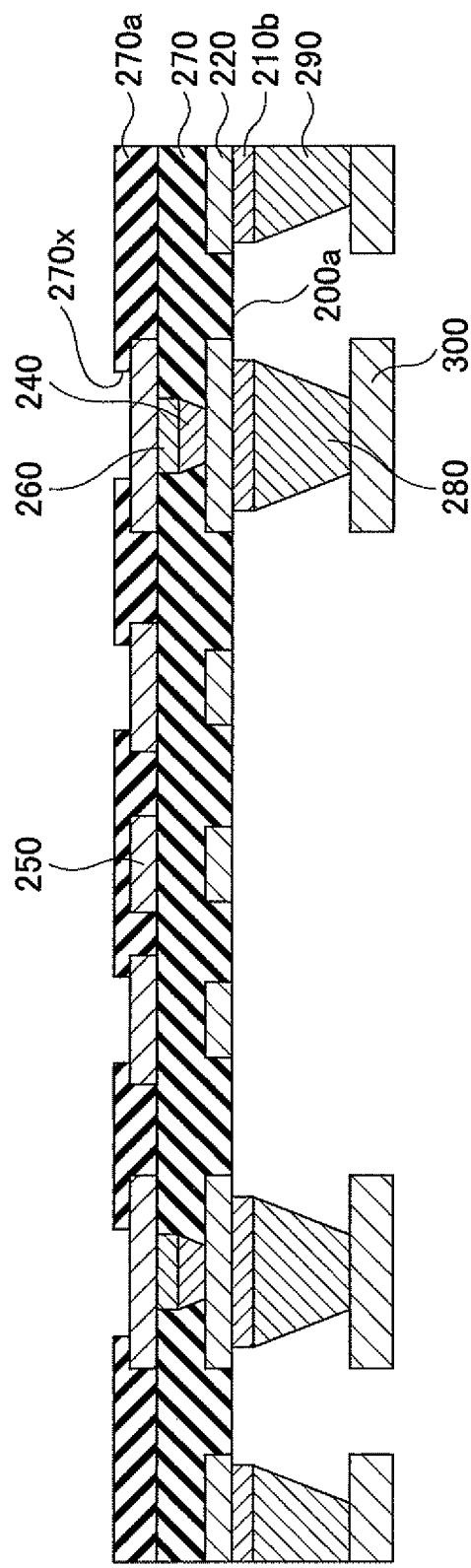
FIG. 12 is a drawing (part 5) illustrating another example of a process step of making the related-art wiring substrate.
Figure 13:
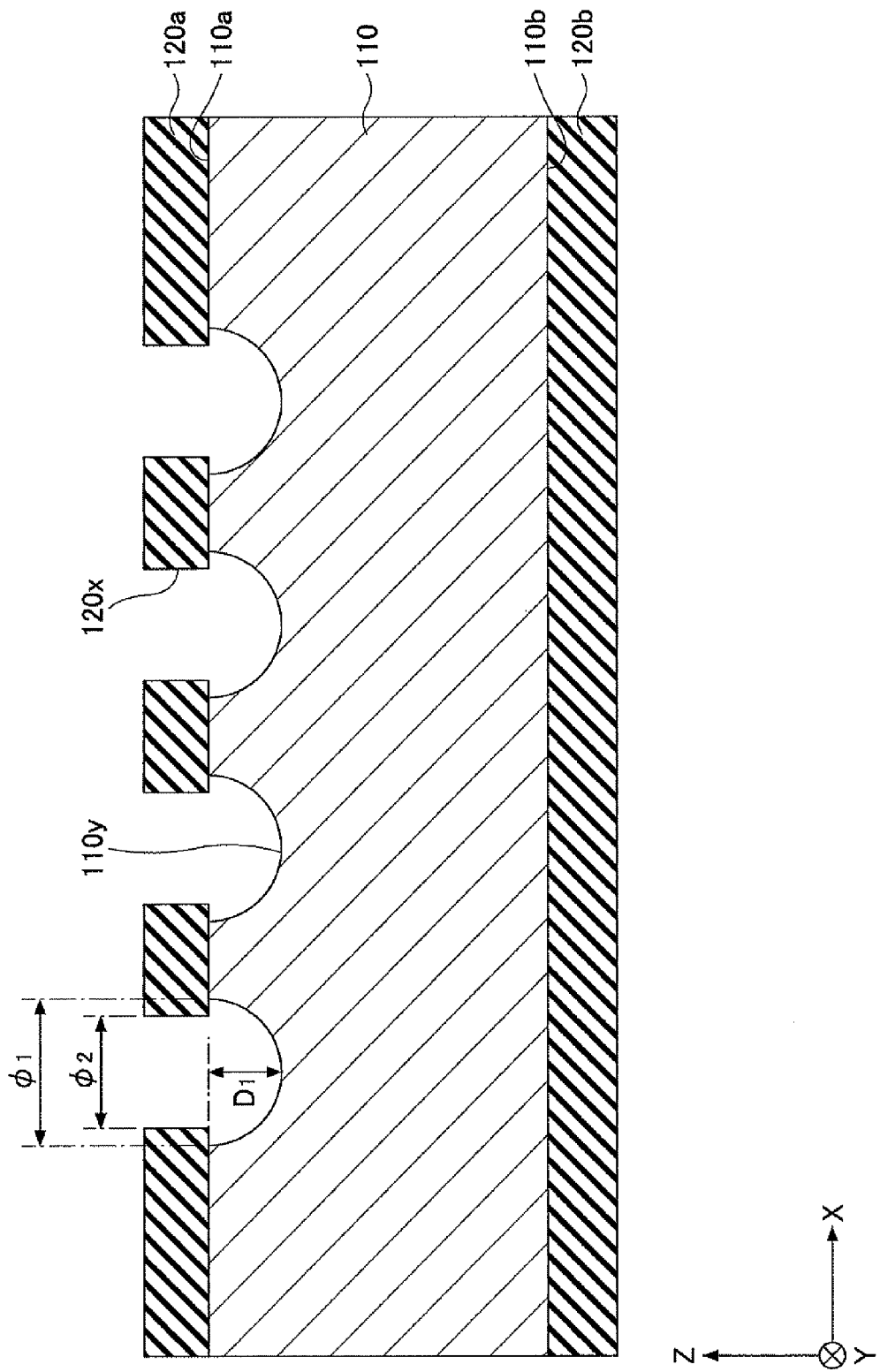
FIG. 13 is a cross-sectional view illustrating an example of the actual shape of holes formed by etching.
Figure 14:
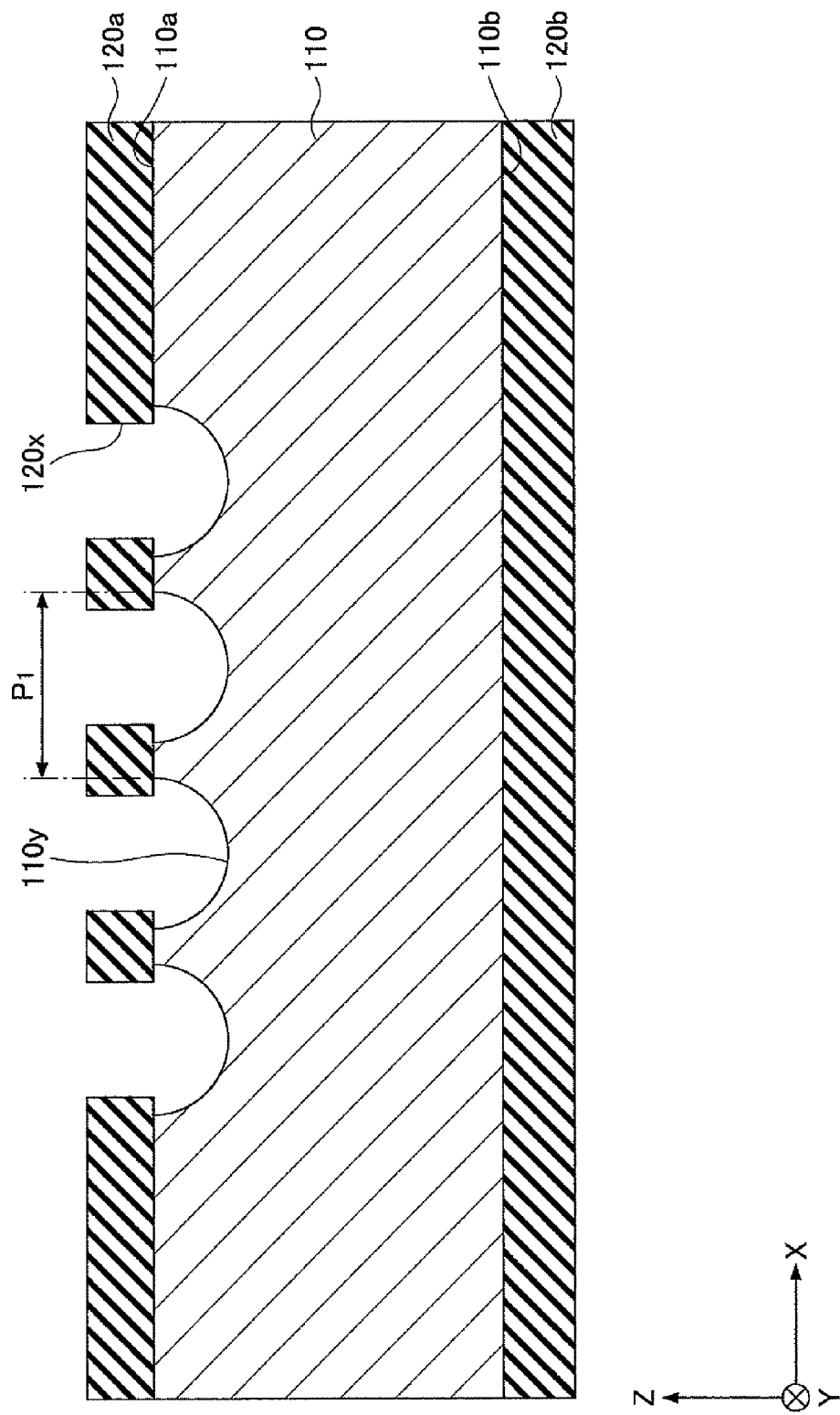
FIG. 14 is a drawing illustrating an example of shortened pitches between adjacent holes illustrated in FIG. 13.
Figure 15:
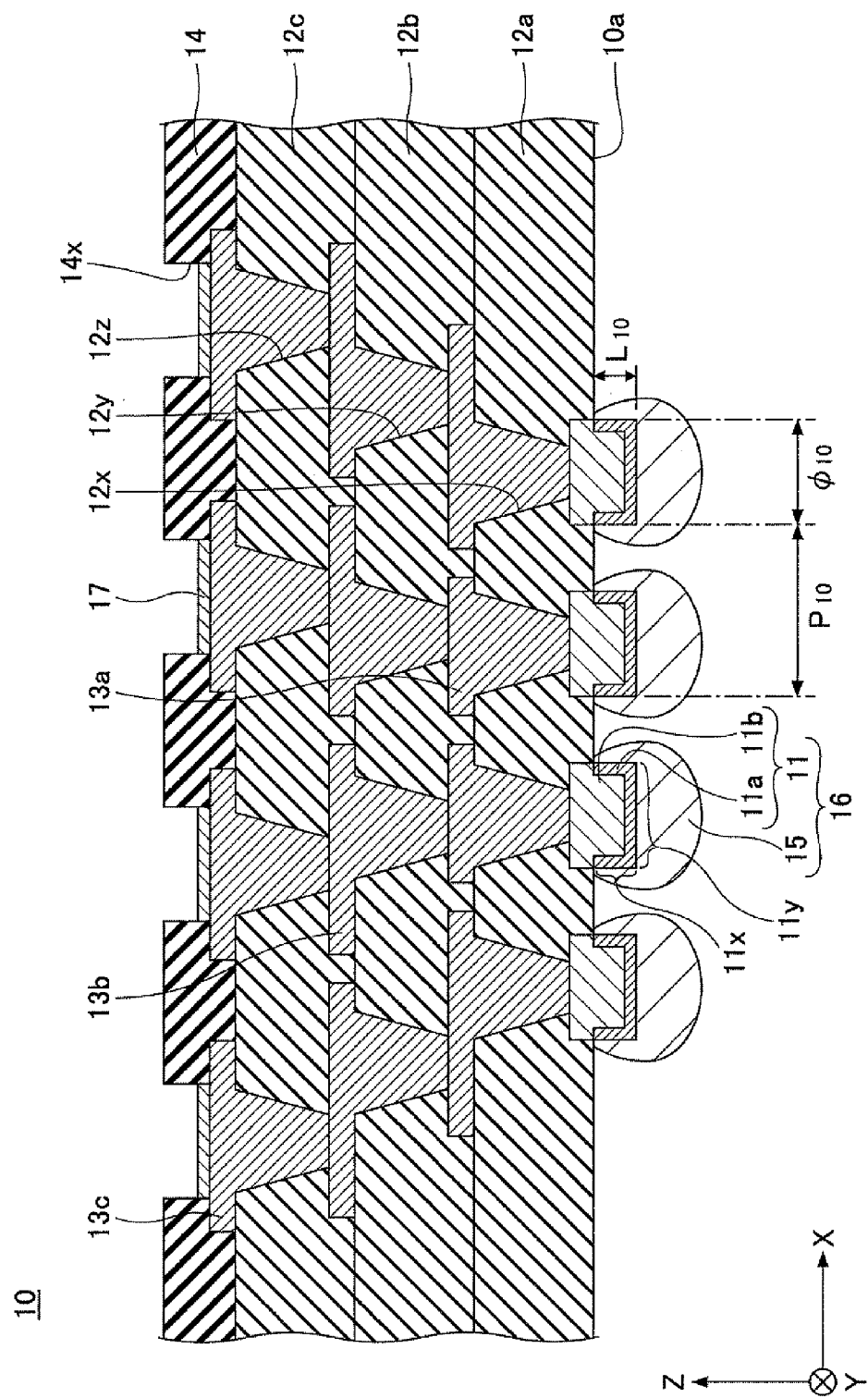
FIG. 15 is a cross-sectional view illustrating an example of a wiring substrate according to the first embodiment.

In the following, a description will be first given of the configuration of a wiring substrate of the first embodiment. FIG. 15 is a cross-sectional view illustrating an example of a wiring substrate according to the first embodiment. In FIG. 15, a wiring substrate 10 has buildup interconnection layers, and includes a first insulating layer 12a, a second insulating layer 12b, a third insulating layer 12c, a first interconnection layer 13a, a second interconnection layer 13b, a third interconnection layer 13c, a solder resist layer 14, connection terminals 16, and a fourth metal layer 17.

The connection terminals 16 are formed on a surface 10a of the wiring substrate 10 for connection to a semiconductor chip. Each of the connection terminals 16 includes a protruding metal layer 11 partly protruding from the surface 10a of the wiring substrate 10 and a bump 15 formed to cover the protruding part of the protruding metal layer 11 protruding from the surface 10a of the wiring substrate 10. The protruding metal layer 11 includes a second metal layer 11a and a third metal layer 11b. The structure of the protruding metal layer 11 is such that the surface of the columnar third metal layer 11b is coated with the second metal layer 11a. The protruding portion of the protruding metal layer 11 that protrudes from the surface 10a of the wiring substrate 10 may hereinafter be referred to as a protruding part 11x for the sake of convenience. Further, a surface of the protruding metal layer 11 opposite the surface in contact with the first insulating layer 12a may be referred to as a surface 11y. The surface 11y is to come in contact with an electrode pad of a semiconductor chip through the solder when the semiconductor chip is mounted on the wiring substrate 10.

A first interconnection layer 13a is formed on the first insulating layer 12a (i.e., on the surface thereof opposite the surface on which the protruding part 11x is formed). The second insulating layer 12b is formed to cover the first interconnection layer 13a and the first insulating layer 12a, and the second interconnection layer 13b is formed on the second insulating layer 12b. The third insulating layer 12c is formed to cover the second interconnection layer 13b and the second insulating layer 12b, and the third interconnection layer 13c is formed on the third insulating layer 12c.

The first interconnection layer 13a and the third metal layer 11b of the protruding metal layer 11 are electrically connected to each other through first via holes 12x formed through the first insulating layer 12a. The first interconnection layer 13a and the second interconnection layer 13b are electrically connected to each other through second via holes 12y formed through the second insulating layer 12b. Further, the second interconnection layer 13b and the third interconnection layer 13c are electrically connected to each other through third via holes 12z formed through the third insulating layer 12c.

The solder resist layer 14 having openings 14x is formed on the third interconnection layer 13c and on the third insulating layer 12c. The fourth metal layer 17 is formed on the areas of the third interconnection layer 13c that are exposed through the openings 14x of the solder resist layer 14. The fourth metal layer 17 serves as electrode pads for connection with a mother board or the like.

In the wiring substrate 10, the protruding part 11x has a rectangular cross-section taken on a plane parallel to the XZ plane, being different from the round shape of the related-art protruding metal layer. The protruding part 11x has a protrusion length $L_{10}$ protruding from the surface 10a of the wiring substrate 10, which is 30 to 50 μm, for example. The shape of the protruding part 11x may be a circular column, with a diameter $\phi_{10}$ of the surface 11y being 60 to 70 μm, for example. A pitch $P_{10}$ of the protruding part 11x may be 150 μm, for example. The shape of the protruding part 11x is not limited to a circular column, and may generally be columnar. Namely, the shape of the protruding part 11x may not be a circular column, but may be an ellipsoidal column or a prismatic column such as a rectangular column or a hexagonal column, for example. In the present application, the term "columnar" may refer to a three-dimensional shape having a top surface and a bottom surface substantially parallel to each other having the same area size. The cross-sectional shape of the columnar protruding part taken on a plane perpendicular to a longitudinal direction of the columnar protruding part may be substantially constant regardless of positions along the longitudinal direction, i.e., may be substantially constant through the entire length of the columnar protruding part. The columnar protruding part may have a flat end surface having a shape identical to the cross-sectional shape.

Au may be used as a material to form the second metal layer 11a of the protruding metal layer 11. The second metal layer 11a of the protruding metal layer 11 may be formed as an Ni and Au layer having an Ni layer and an Au layer stacked in this order on the third metal layer 11b of the protruding metal layer 11, or may be formed as an Ni, Pd, and Au layer having an Ni layer, a Pd layer, and an Au layer stacked in this order on the third metal layer 11b. Cu or the like may be used as a material to form the third metal layer 11b of the protruding metal layer 11. An alloy including Pb, an alloy of Sn and Cu, an alloy of Sn and Ag, or an alloy of Sn, Ag, and Cu may be used as a material to form the solder bump 15.

Since the protruding part 11x has a rectangular cross-section taken on a plane parallel to the XZ plane, the aspect ratio $(L_{10}/\phi_{10})$ is large. Connection terminals that can properly be used in a narrow-pitch arrangement are thus provided. Further, the rectangular cross-section parallel to the XZ plane makes it possible to provide the surface 11y of a large area size, which comes in contact with an electrode pad of a semiconductor chip through solder when the semiconductor chip is mounted on the wiring substrate, thereby providing a connection terminal having high connection reliability. The structure of the wiring substrate of the first embodiment has been described above.

Method of Making Wiring Substrate of First Embodiment

In the following, a description will be given of a method of making a wiring substrate of the first embodiment. FIGS. 16 through 30 are drawings illustrating examples of process steps for making a wiring substrate according to the first embodiment. In FIGS. 16 through 30, the same elements as those of FIG. 15 are referred to by the same numerals, and a description thereof may be omitted.

Figure 16:
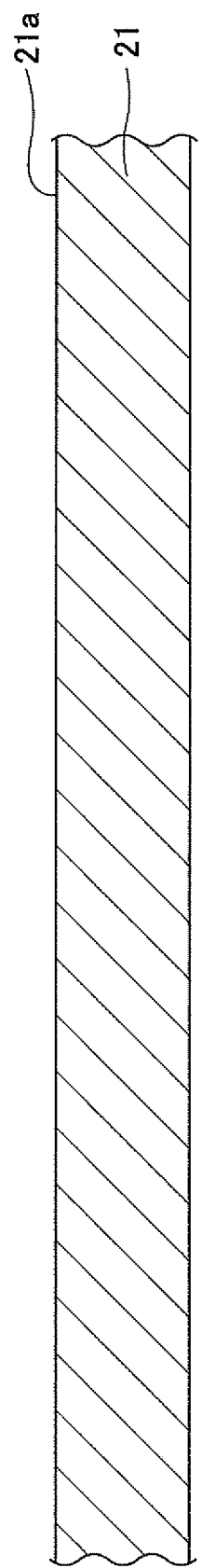
FIG. 16 is a drawing (part 1) illustrating an example of a process step of making the wiring substrate according to the first embodiment.
Figure 17:
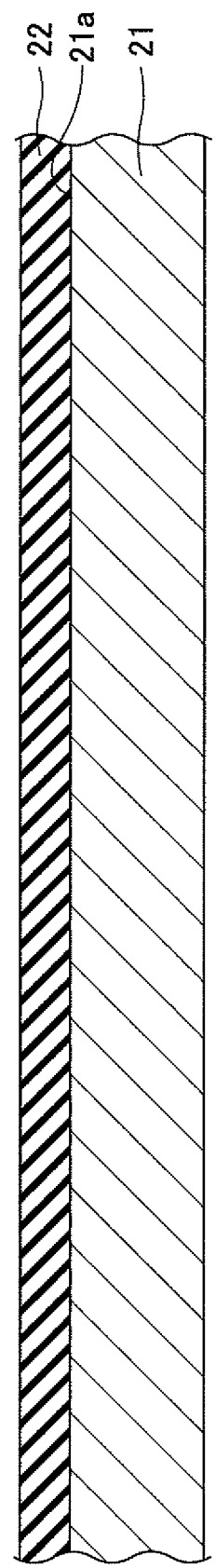
FIG. 17 is a drawing (part 2) illustrating an example of a process step of making the wiring substrate according to the first embodiment.

In the process step illustrated in FIG. 16, a support member 21 is provided. The support member 21 has a surface 21a. In this embodiment, a Cu foil may be used as the support member 21. The thickness of the support member 21 may be 35 to 100 μm, for example. In the process step illustrated in FIG. 17, a resist layer 22 is formed on the surface 21a of the support member 21. (In actuality, the surface of the support member 21 opposite the surface 21a is also covered with a resist layer.) A dry film may be used as the resist layer 22. The thickness of the resist layer 22 may be 30 to 50 μm, for example.

Figure 18:
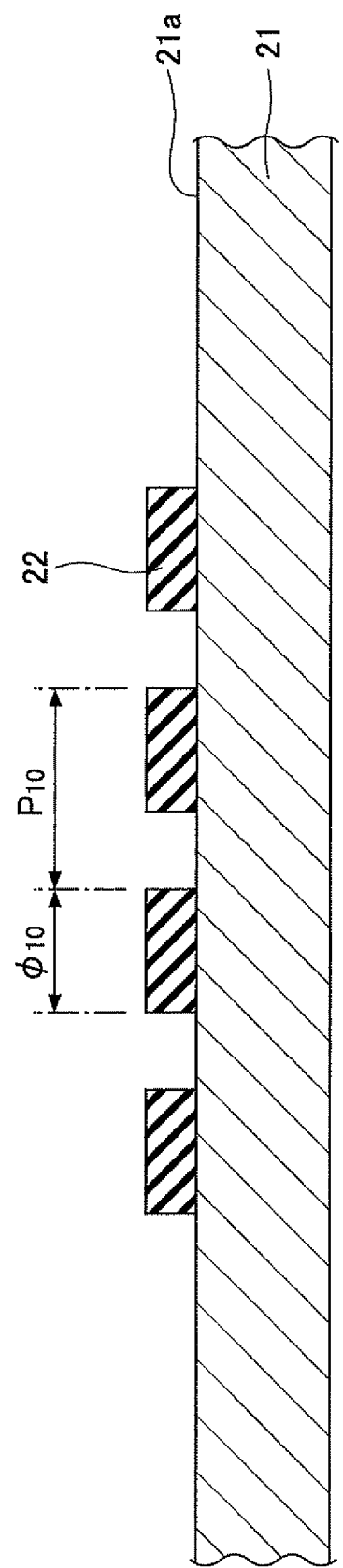
FIG. 18 is a drawing (part 3) illustrating an example of a process step of making the wiring substrate according to the first embodiment.

In the process step illustrated in FIG. 18, a patterning process is performed with respect to the resist layer 22 to remove the resist layer 22 except at the positions where the protruding metal layer 11 is to be formed. The shape of the remaining portions of the resist layer 22 may be a circular column, with a diameter $\phi_{10}$ of its cross-section being 60 to 70 μm, for example. The shape of the remaining portions of the resist layer 22 is not limited to a circular column, and may generally be columnar. Namely, the shape of the remaining portions of the resist layer 22 may not be a circular column, but may be an ellipsoidal column or a prismatic column such as a rectangular column or a hexagonal column. A pitch $P_{10}$ of the remaining portions of the resist layer 22 may be 150 μm, for example.

Figure 19:
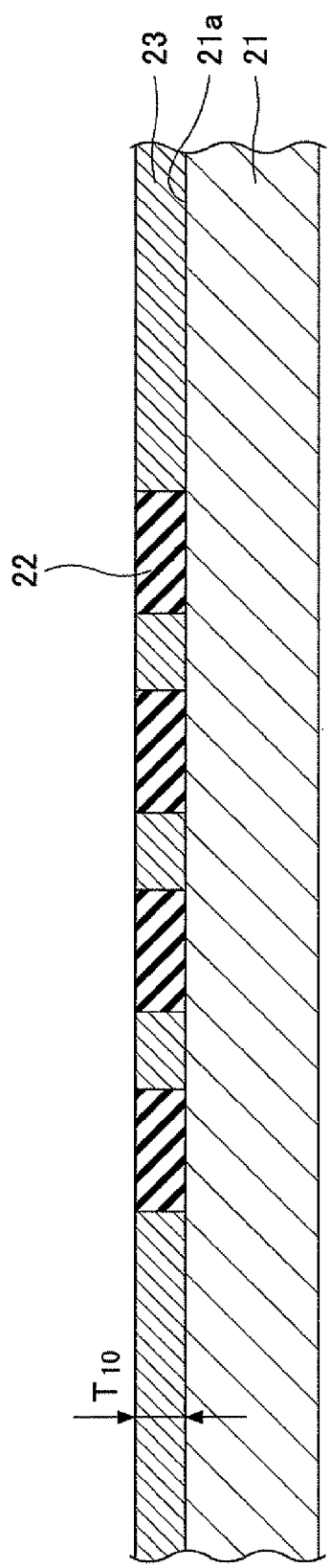
FIG. 19 is a drawing (part 4) illustrating an example of a process step of making the wiring substrate according to the first embodiment.

In the process step illustrated in FIG. 19, a first metal layer 23 is formed on the surface 21a of the support member 21 by electrolytic plating that utilizes the support member 21 as a power feeding layer for electroplating. The first metal layer 23 is formed on the surface 21a of the support member 21 in the areas where no resist layer 22 remains. The first metal layer 23 is to be removed by etching together with the support member 21 in the process step illustrated in FIG. 30, which will be described later. Because of this, the support member 21 and the first metal layer 23 are preferably made of materials that are removable by the same etching solution. Specifically, Cu may preferably be used as the material for the first metal layer 23 because a Cu foil is used as the support member 21 in the present embodiment. A thickness $T_{10}$ of the first metal layer 23 may be 30 to 50 μm, for example. The thickness $T_{10}$ of the first metal layer 23 controls the protrusion length $L_{10}$ of the protruding part 11x protruding from the surface 10a of the wiring substrate 10. In other words, the protrusion length $L_{10}$ of the protruding part 11x protruding from the surface 10a of the wiring substrate 10 will be substantially equal the thickness $T_{10}$ of the first metal layer 23.

Figure 20:
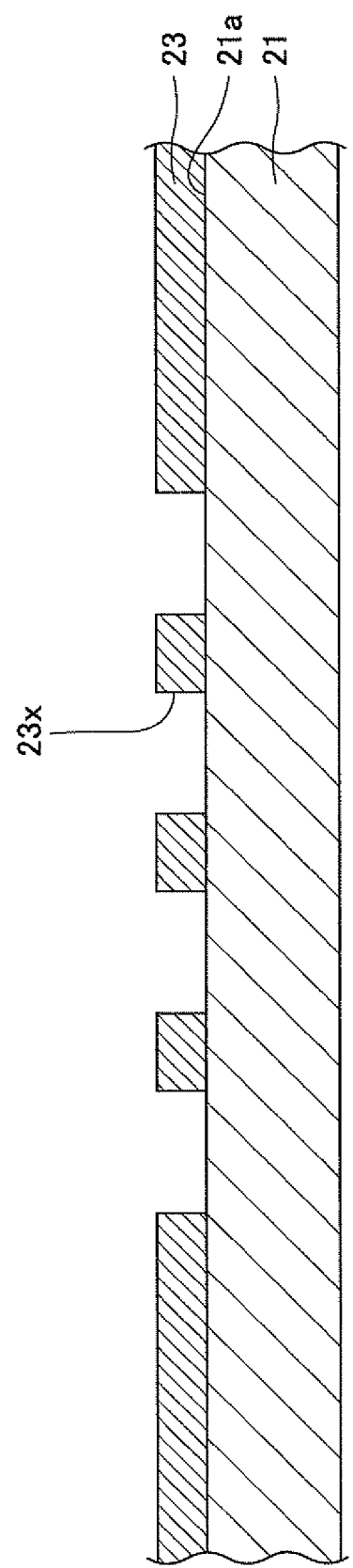
FIG. 20 is a drawing (part 5) illustrating an example of a process step of making the wiring substrate according to the first embodiment.
Figure 21:
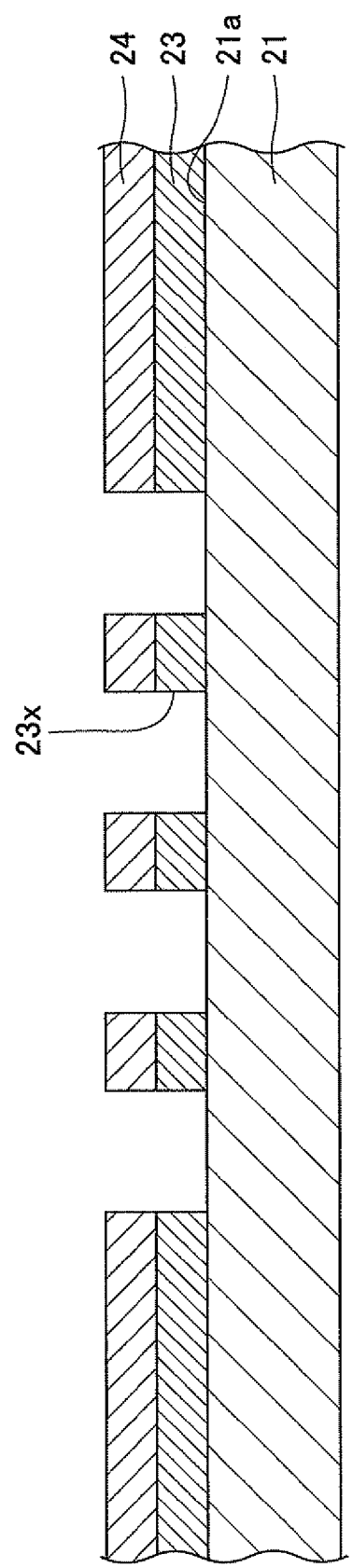
FIG. 21 is a drawing (part 6) illustrating an example of a process step of making the wiring substrate according to the first embodiment.

In the process step illustrated in FIG. 20, the resist layer 22 illustrated in FIG. 19 is removed to form openings 23x. In this manner, the first metal layer 23 having the openings 23x serving as cylindrical through holes for exposing the surface 21a of the support member 21 is formed on the surface 21a of the support member 21. In the process step illustrated in FIG. 21, a resist layer 24 is formed on the first metal layer 23. The resist layer 24 has openings having the same shapes as the shapes of the openings 23x. A dry film may be used as the resist layer 24. The thickness of the resist layer 24 may be 30 to 50 μm, for example.

Figure 22A:
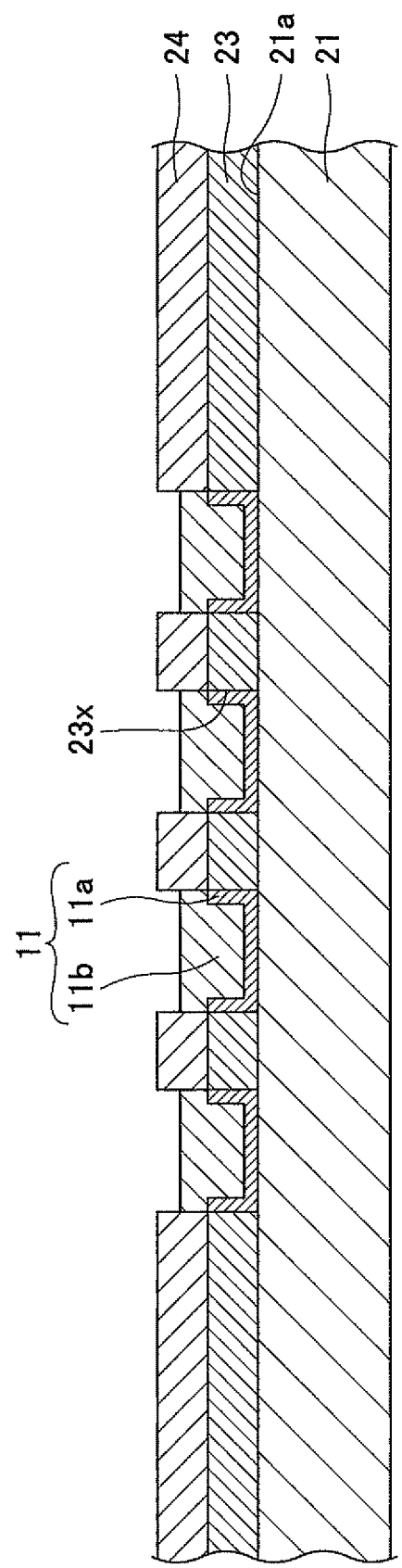
FIGS. 22A and 22B are drawings (part 7) illustrating an example of a process step of making the wiring substrate according to the first embodiment.
Figure 22B:
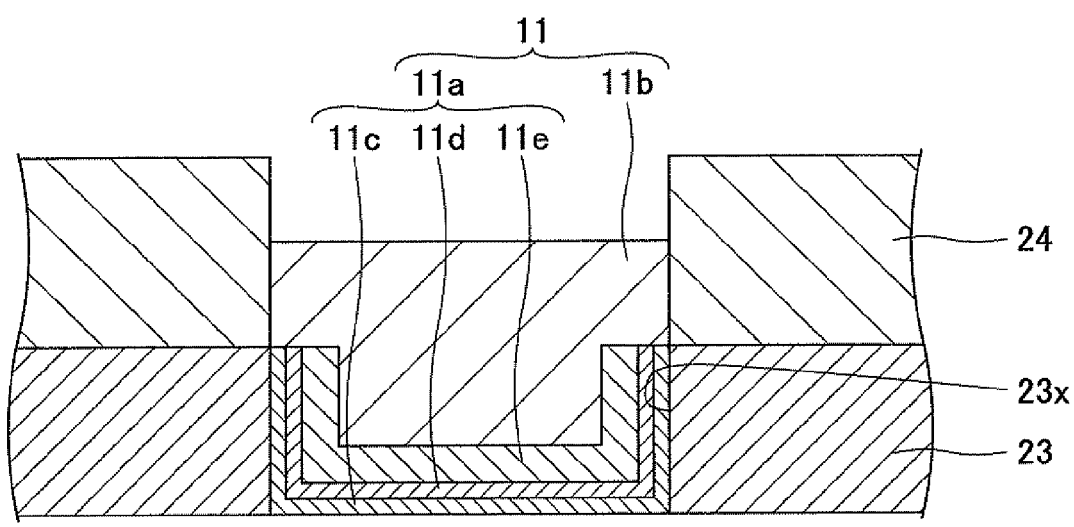

In the process step illustrated in FIGS. 22A and 22B, electrolytic plating that utilizes the support member 21 and the first metal layer 23 as power feeding layers for electroplating is performed to form the second metal layer 11a and the third metal layer 11b stacked in this order in the openings 23x to form the protruding metal layer 11. The second metal layer 11a is formed to cover the surface 21a of the support member 21 exposed through the openings 23x and to cover or coat the inner wall surfaces of the openings 23x. The second metal layer 11a may have a substantially constant thickness on the surface 21a and on the inner wall surface, such that an inner hole made by the opening 23x coated with the second metal layer 11a has substantially the same shape as the opening 23x, with a reduced size. The third metal layer 11b is formed on the second metal layer 11a to at least fully fill the openings 23x. The material of the second metal layer 11a may be Au, for example. The material of the third metal layer 11b may be Cu, for example (see FIG. 22A).

The second metal layer 11a may have a structure in which plural metal layers made of different materials are stacked one over another. FIG. 22B illustrates an example of the second metal layer 11a having a structure in which plural metal layers made of different materials are stacked one over another. In the second metal layer 11a illustrated in FIG. 22B, a metal layer 11c may be formed as an Au layer with a layer thickness of approximately 1 μm, for example, a metal layer 11d formed as a Pd layer with a layer thickness of approximately 1 μm, for example, and a metal layer 11e formed as an Ni layer with a layer thickness of approximately 5 μm, for example. Another example of the second metal layer 11a having a structure in which plural metal layers made of different materials are stacked one over another may have an Au and Ni layer including an Au layer and an Ni layer stacked in this order.

Figure 23:
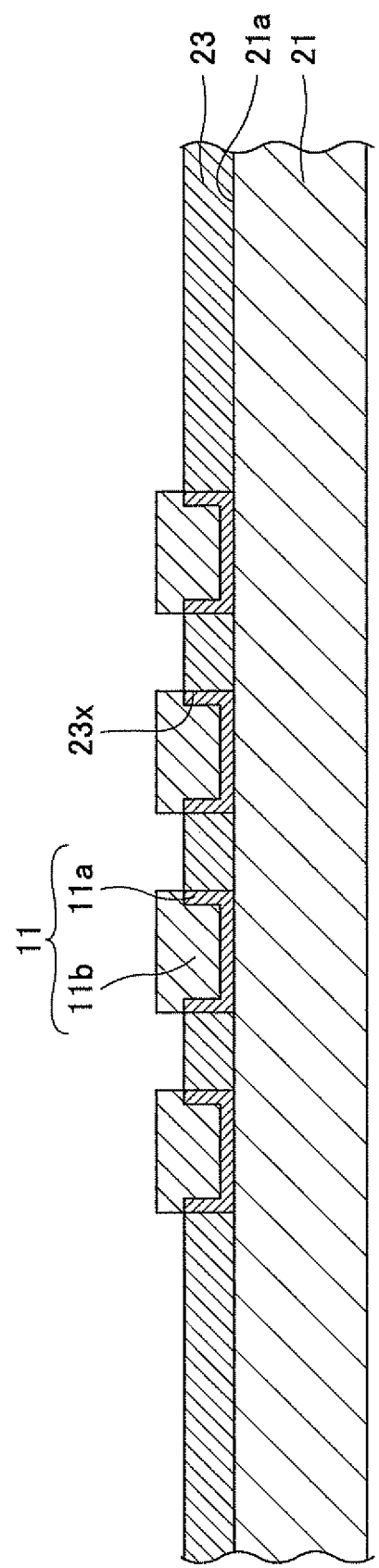
FIG. 23 is a drawing (part 8) illustrating an example of a process step of making the wiring substrate according to the first embodiment.
Figure 24:
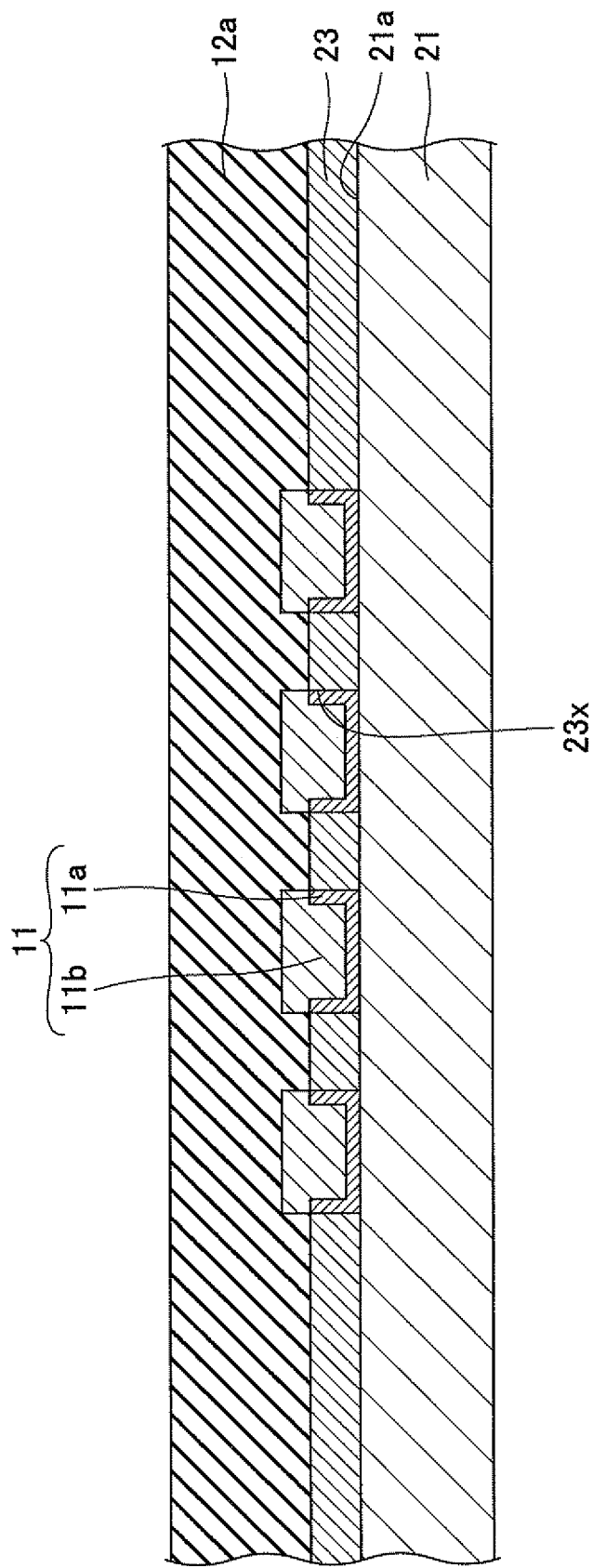
FIG. 24 is a drawing (part 9) illustrating an example of a process step of making the wiring substrate according to the first embodiment.

In the process step illustrated in FIG. 23, the resist layer 24 illustrated in FIG. 22A is removed. In the process step illustrated in FIG. 24, a first insulating layer 12a is formed on the first metal layer 23 to cover the third metal layer 11b of the protruding metal layer 11. The material of the first insulating layer 12a may be a resin such as an epoxy-system resin or a polyimide-system resin. An example of a method of forming the first insulating layer 12a is to laminate the first metal layer 23 with a resin film, to press the resin film, and to cure the resin film by performing a heat treatment using a temperature of approximately 190 degrees Celsius, thereby forming the first insulating layer 12a.

Figure 25:
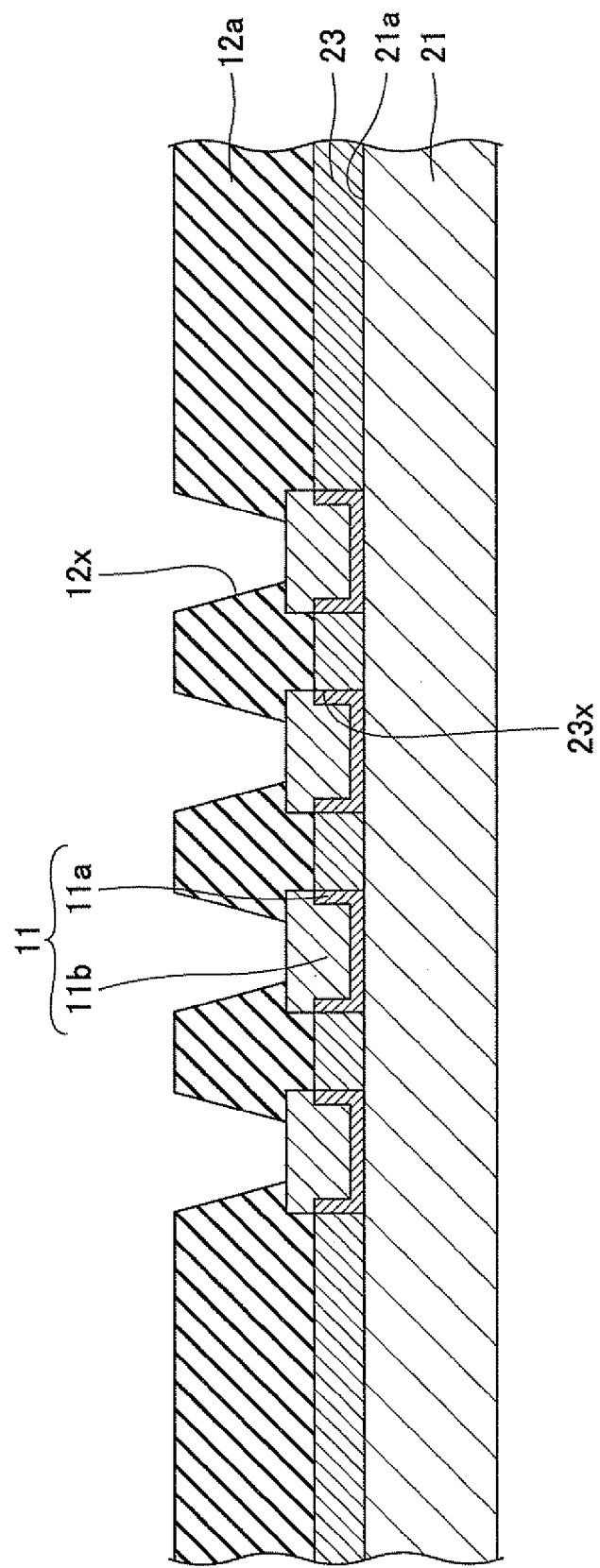
FIG. 25 is a drawing (part 10) illustrating an example of a process step of making the wiring substrate according to the first embodiment.

In the process step illustrated in FIG. 25, a laser process or the like is performed with respect to the first insulating layer 12a formed on the support member 21 to form the first via holes 12x penetrating through the first insulating layer 12a, such that the third metal layer 11b of the protruding metal layer 11 is exposed. A photosensitive resist film may be used as the first insulating layer 12a, which may be patterned by photolithography to form the first via holes 12x. Alternatively, a resist film having openings formed by screen printing may be used for patterning to form the first via holes 12x.

Figure 26:
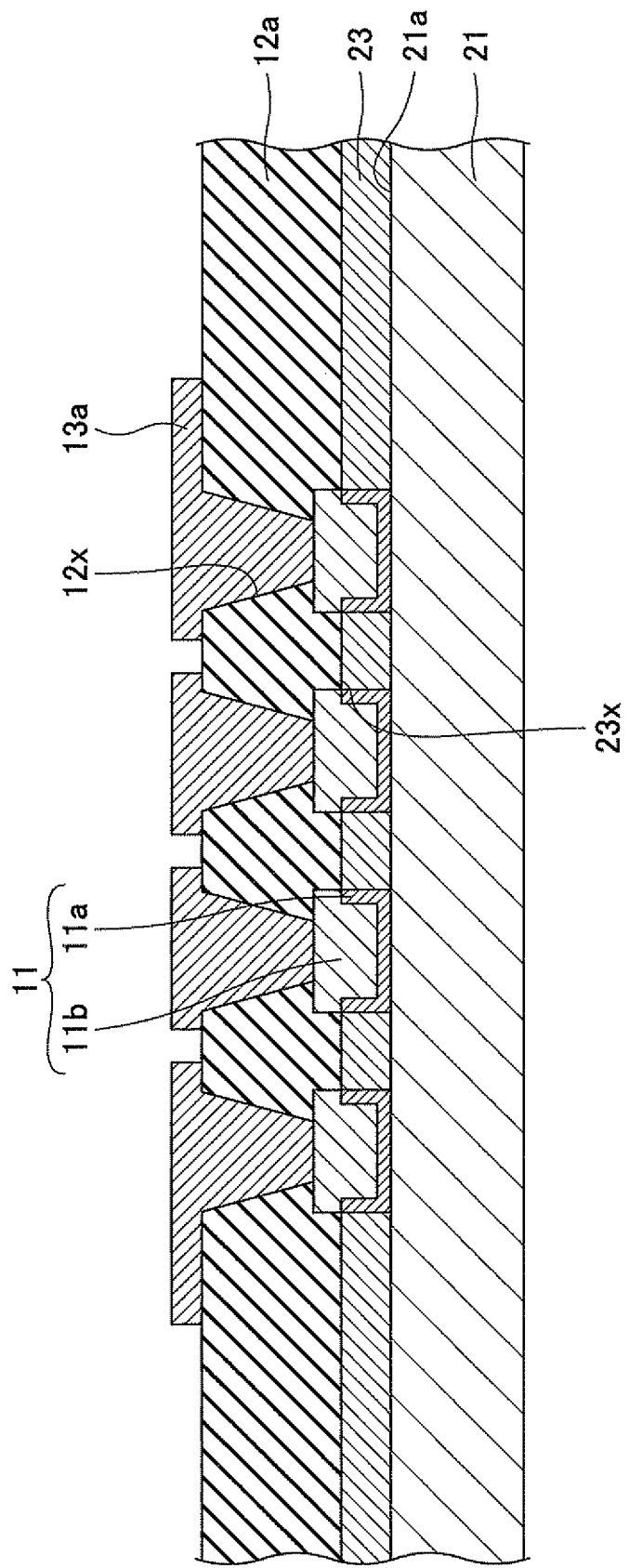
FIG. 26 is a drawing (part 11) illustrating an example of a process step of making the wiring substrate according to the first embodiment.

In the process step illustrated in FIG. 26, a first interconnection layer 13a is formed on the first insulating layer 12a, and is electrically connected to the third metal layer 11b of the protruding metal layer 11 that is exposed through the first via holes 12x. The material of the first interconnection layer 13a may be Cu, for example. The first interconnection layer 13a may be formed by use of a semi-additive method, for example.

An example of forming the first interconnection layer 13a by use of a semi-additive method will be described below in more detail. First, an electroless plating or sputtering method is employed to form a Cu seed layer (not shown) on the first insulating layer 12a and in the first via holes 12x. Next, a resist layer (not shown) having openings at the positions of the first interconnection layer 13a is formed. Then, electrolytic plating is performed by using the Cu seed layer as a plating power feed layer to form a Cu layer pattern (not shown) in the openings of the resist layer.

The resist layer is thereafter removed, followed by etching the Cu seed layer by using the Cu layer pattern as a mask, thereby obtaining the first interconnection layer 13a. As a method of forming the first interconnection layer 13a, a subtractive method or other types of methods for forming interconnections may be used in place of the semi-additive method described above.

Figure 27:
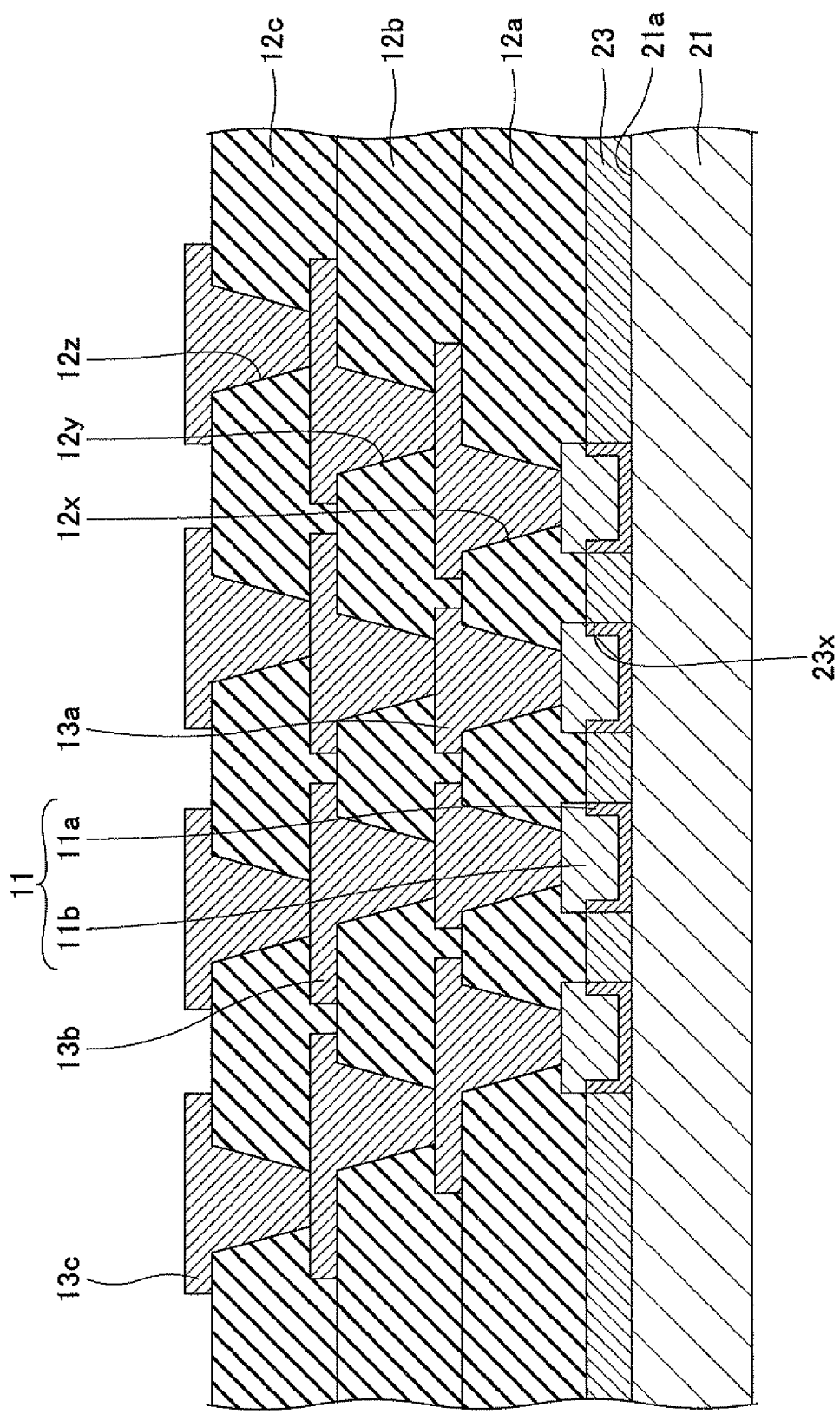
FIG. 27 is a drawing (part 12) illustrating an example of a process step of making the wiring substrate according to the first embodiment.

In the process step illustrated in FIG. 27, process steps similar to those described above are repeated to stack the first interconnection layer 13a through the third interconnection layer 13c and the first insulating layer 12a through the third insulating layer 12c. Namely, the second insulating layer 12b is formed to cover the first interconnection layer 13a and the first insulating layer 12a, followed by forming the second via holes 12y through the second insulating layer 12b on the first interconnection layer 13a.

Moreover, the second interconnection layer 13b connected through the second via holes 12y to the first interconnection layer 13a is formed on the second insulating layer 12b. The material of the second interconnection layer 13b may be Cu, for example. The second interconnection layer 13b may be formed by use of a semi-additive method, for example.

Further, the third insulating layer 12c is formed to cover the second interconnection layer 13b and the second insulating layer 12b, followed by forming the third via holes 12z through the third insulating layer 12c on the second interconnection layer 13b. The third interconnection layer 13c connected through the third via holes 12z to the second interconnection layer 13b is formed on the third insulating layer 12c. The material of the third interconnection layer 13c may be Cu, for example. The third interconnection layer 13c may be formed by use of a semi-additive method, for example.

In this manner, the buildup interconnection layers are formed on the surface 21a of the support member 21. Three buildup interconnection layers (i.e., the first interconnection layer 13a through third interconnection layer 13c) are formed in this embodiment. This is not a limiting example, and n (n: positive integer) buildup interconnection layers may be formed.

Figure 28:
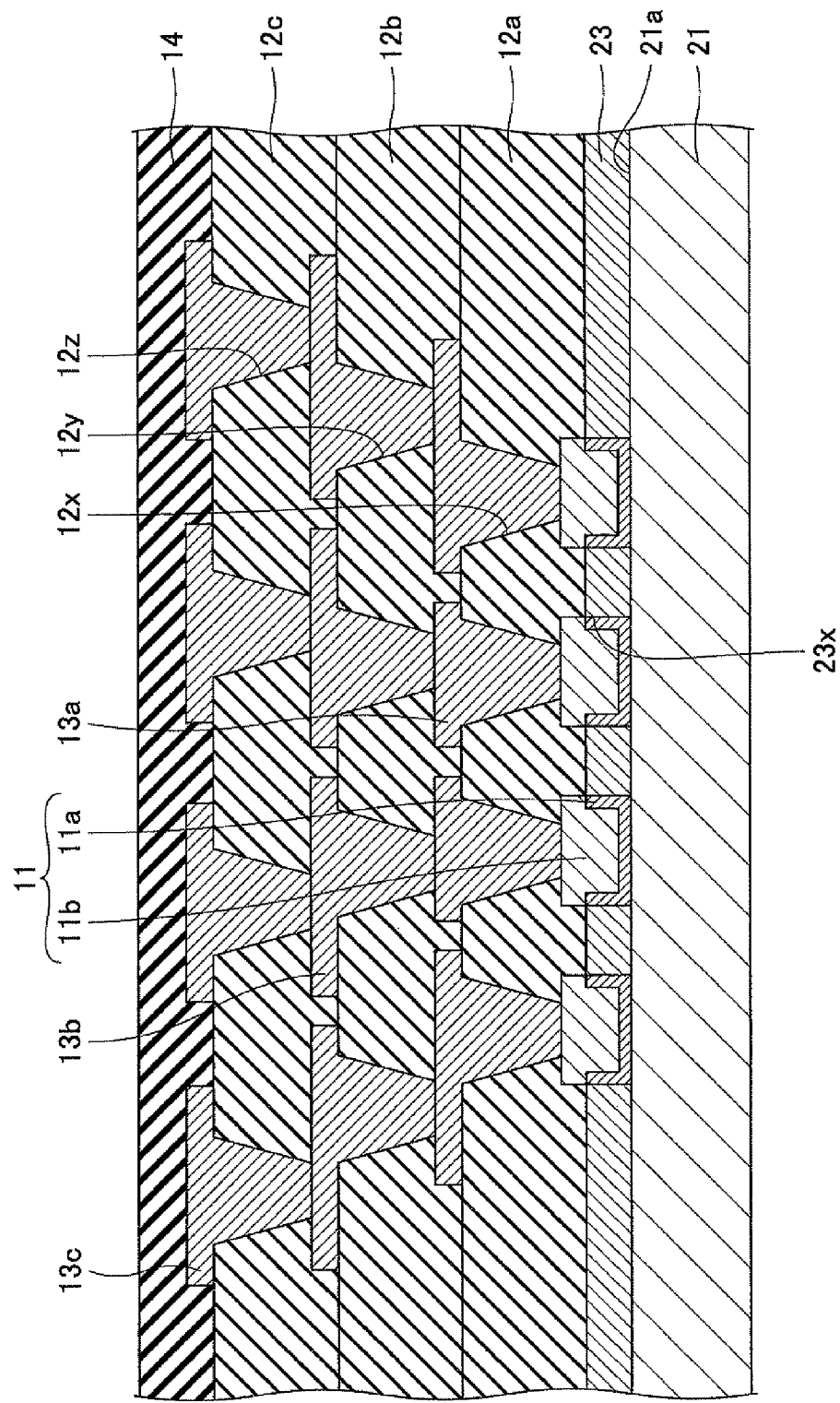
FIG. 28 is a drawing (part 13) illustrating an example of a process step of making the wiring substrate according to the first embodiment.

In the process step illustrated in FIG. 28, a solder resist layer 14 is formed by applying solder resist on the third insulating layer 12c and on the third interconnection layer 13c. A photosensitive resin component including an epoxy-system resin, an imide-system resin, or the like may be used as the material of the solder resist layer 14.

Figure 29:
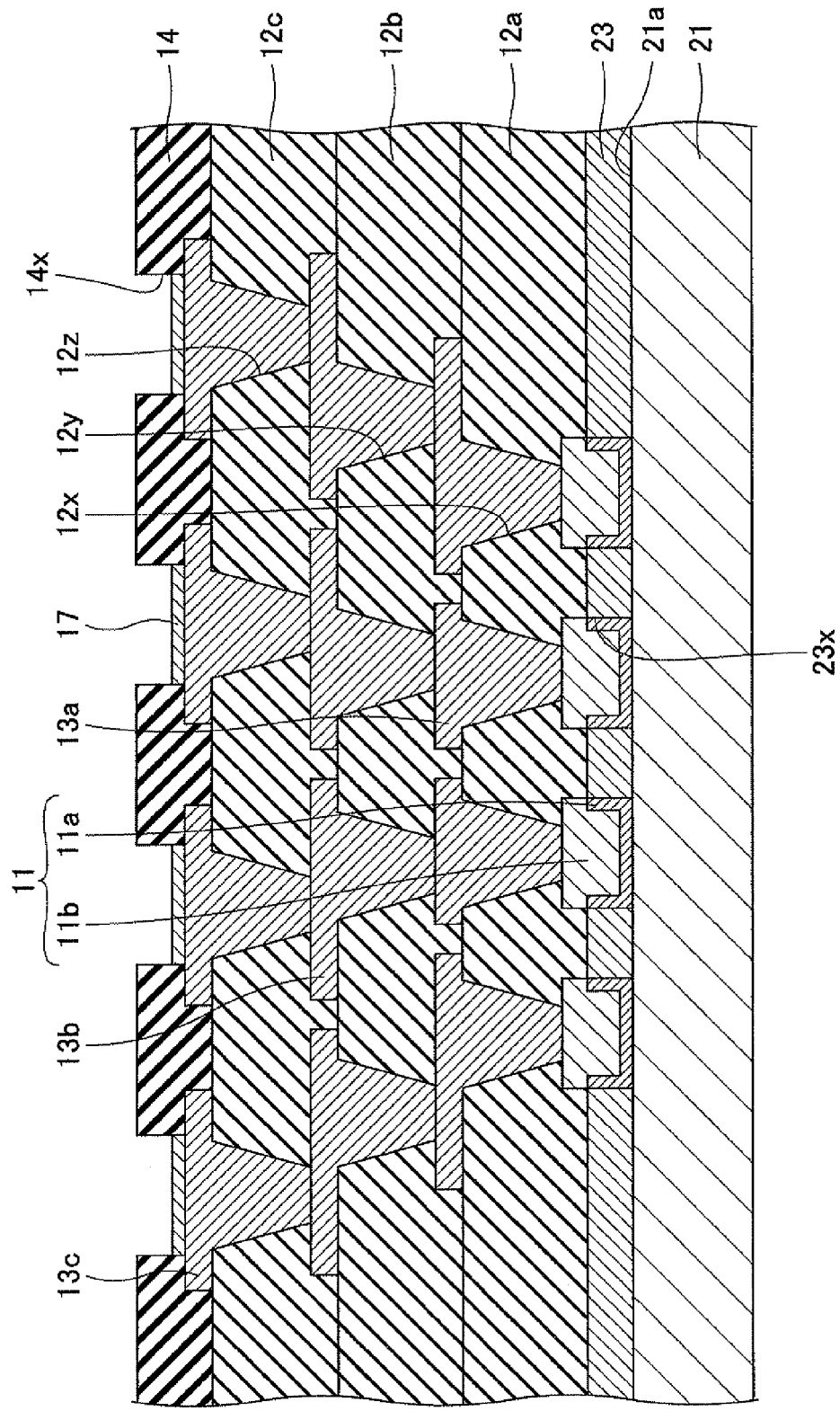
FIG. 29 is a drawing (part 14) illustrating an example of a process step of making the wiring substrate according to the first embodiment.

In the process step illustrated in FIG. 29, the solder resist layer 14 is exposed to light for development, thereby forming the openings 14x. As a result, part of the third interconnection layer 13c is exposed through the openings 14x of the solder resist layer 14. A fourth metal layer 17 is then formed by electroless plating or the like on the areas of the third interconnection layer 13c that are exposed through the openings 14x of the solder resist layer 14. The fourth metal layer 17 serves as electrode pads for connection with a mother board or the like.

An example of the fourth metal layer 17 includes an Ni and Au layer comprised of an Ni layer and Au layer stacked one over another in this order, and also includes an Ni, Pd, and Au layer comprised of an Ni layer, a Pd layer, and an Au layer stacked one over another in this order. In place of the fourth metal layer 17, an OSP (organic solderability preservative) process may be applied to the areas of the third interconnection layer 13c that are exposed through the openings 14x of the solder resist layer 14.

Figure 30:
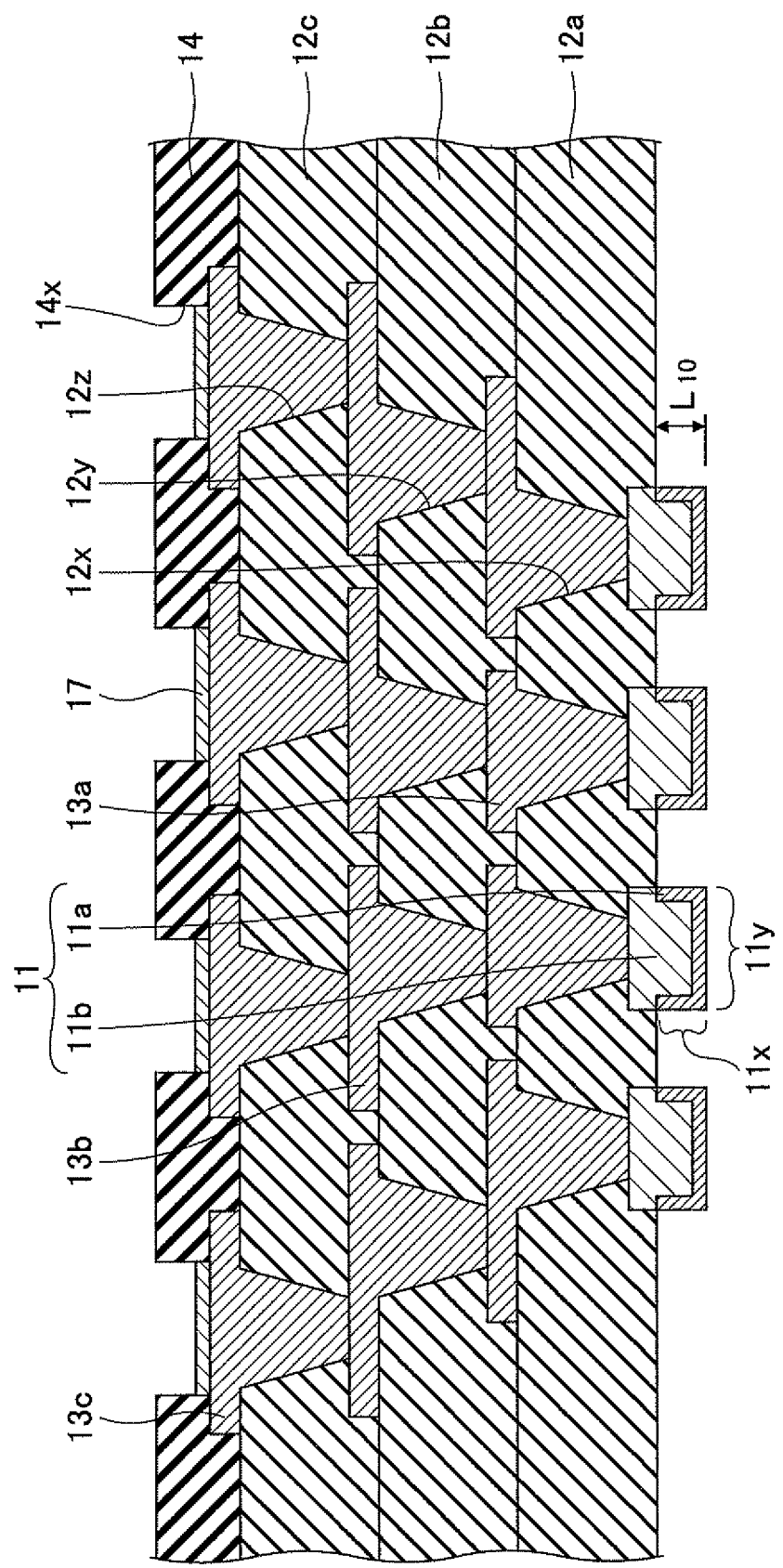
FIG. 30 is a drawing (part 15) illustrating an example of a process step of making the wiring substrate according to the first embodiment.

In the process step illustrated in FIG. 30, the support member 21 and the first metal layer 23 illustrated in FIG. 29 are removed to cause at least part of the protruding metal layer 11 (i.e., the second metal layer 11a and the third metal layer 11b) to protrude from the first insulating layer 12a, thereby forming the cylindrical protruding part 11x. The protrusion length $L_{10}$ of the protruding part 11x corresponds to the thickness $T_{10}$ of the first metal layer 23 illustrated in FIG. 19, and is 30 to 50 μm, for example.

In the case that both the support member 21 and the first metal layer 23 are made of Cu, the support member 21 and the first metal layer 23 are removable by the same etching solution. For example, wet etching using aqueous ferric chloride, aqueous copper chloride, aqueous ammonium persulfate, or the like may be performed to remove the support member 21 and the first metal layer 23. Since the second metal layer 11a of the protruding metal layer 11 is made of a material (e.g., Au) other than Cu, the support member 21 and the first metal layer 23 are selectively removed by etching without removing the second metal layer 11a.

Solder bumps 15 are then formed to cover the protruding part 11x of the protruding metal layer 11, thereby forming the wiring substrate 10 illustrated in FIG. 15. Specifically, solder paste is printed to cover the protruding part 11x of the protruding metal layer 11, followed by performing a reflow process to form the solder bumps 15, for example. An alloy including Pb, an alloy of Sn and Cu, an alloy of Sn and Ag, or an alloy of Sn, Ag, and Cu may be used as a material to form the solder bump 15. The protruding metal layer 11 and the solder bumps 15 constitute the connection terminals 16, which are used for connection with a semiconductor chip.

The solder bumps 15 may not be formed on the wiring substrate 10. For example, solder bumps may be formed on electrode pads of a semiconductor chip that is to be mounted on the wiring substrate 10. These solder bumps formed on the semiconductor chip and the protruding part 11x of the protruding metal layer 11 of the wiring substrate 10 may be electrically connected. The method of forming a wiring substrate of the first embodiment has been described above.

According to the first embodiment, an opening for forming a protruding metal layer is not formed by etching as in the related-art methods, but is formed by plating. Because of this, the shape of the part (i.e., protruding part) of the protruding metal layer that protrudes from the surface of the wiring substrate is made into a columnar shape. That is, the cross-section of the protruding part has a rectangular shape rather than a round shape. As a result, the aspect ratio of the protruding part of the protruding metal layer is increased. Connection terminals that can properly be used in a narrow-pitch arrangement are thus provided. Further, it is possible to provide the protruding part of the protruding metal layer with a surface of a large area size, which comes in contact with an electrode pad of a semiconductor chip through solder when the semiconductor chip is mounted on the wiring substrate, thereby providing a connection terminal having high connection reliability.

Second Embodiment

The second embodiment is directed to another example of a wiring substrate having a multilayer interconnection structure (i.e., having buildup interconnection layers). In respect of the second embodiment, a description may be omitted for those parts which are in common with the first embodiment, and those parts which differ from the first embodiment will mainly be described.

Structure of Wiring Substrate of Second Embodiment

Figure 31:
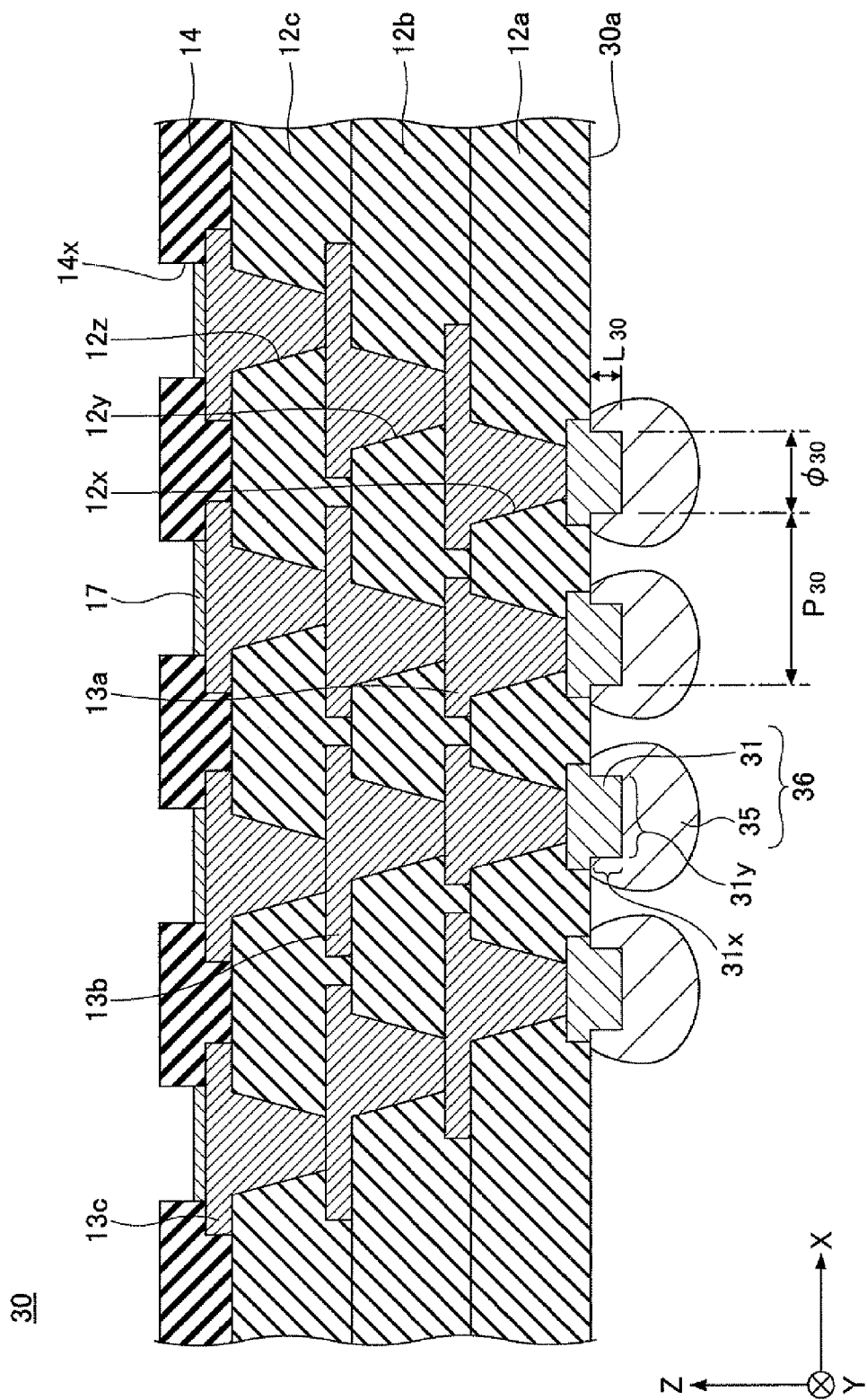
FIG. 31 is a cross-sectional view illustrating an example of a wiring substrate according to the second embodiment.
Figure 32:
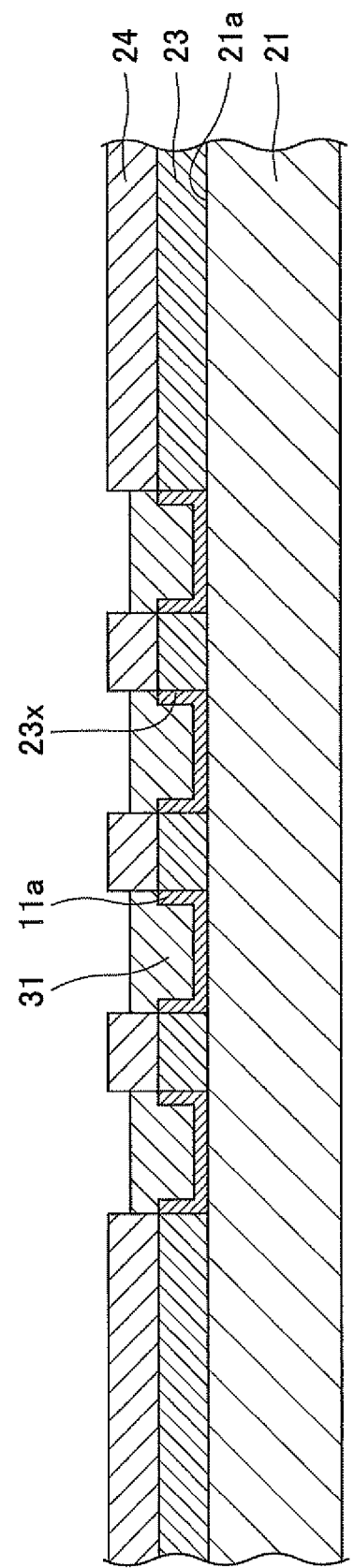
FIG. 32 is a drawing (part 1) illustrating an example of a process step of making the wiring substrate according to the second embodiment.

In the following, a description will be first given of the configuration of a wiring substrate of the second embodiment. FIG. 31 is a cross-sectional view illustrating an example of a wiring substrate according to the second embodiment. In FIG. 31, a wiring substrate 30 has buildup interconnection layers, and includes a first insulating layer 12a, a second insulating layer 12b, a third insulating layer 12c, a first interconnection layer 13a, a second interconnection layer 13b, a third interconnection layer 13c, a solder resist layer 14, connection terminals 36, and a fourth metal layer 17.

The connection terminals 36 are formed on a surface 30a of the wiring substrate 30 for connection to a semiconductor chip. Each of the connection terminals 36 includes a protruding metal layer 31 partly protruding from the surface 30a of the wiring substrate 30 and a bump 35 formed to cover the protruding metal layer 31. The first interconnection layer 13a and the protruding metal layer 31 are electrically connected to each other through first via holes 12x formed through the first insulating layer 12a. The protruding portion of the protruding metal layer 31 that protrudes from the surface 30a of the wiring substrate 30 may hereinafter be referred to as a protruding part 31x for the sake of convenience. Further, a surface of the protruding metal layer 31 opposite the surface in contact with the first insulating layer 12a may be referred to as a surface 31y. The surface 31y is to come in contact with an electrode pad of a semiconductor chip through the solder when the semiconductor chip is mounted on the wiring substrate 30.

In the wiring substrate 30, the protruding part 31x has a rectangular cross-section taken on a plane parallel to the XZ plane, being different from the round shape of the related-art protruding metal layer. The protruding part 31x has a protrusion length $L_{30}$ protruding from the surface 30a of the wiring substrate 30, which is 30 to 50 µm, for example. The shape of the protruding part 31x may be a circular column, with a diameter $\phi_{30}$ of the surface 31y being 60 to 70 µm, for example. A pitch $P_{30}$ of the protruding part 31x may be 150 µm, for example. The shape of the protruding part 31x is not limited to a circular column, and may generally be columnar. Namely, the shape of the protruding part 31x may not be a circular column, but may be an ellipsoidal column or a prismatic column such as a rectangular column or a hexagonal column.

Cu or the like may be used as the material of the protruding metal layer 31. An alloy including Pb, an alloy of Sn and Cu, an alloy of Sn and Ag, or an alloy of Sn, Ag, and Cu may be used as a material to form the solder bump 35.

Since the protruding part 31x has a rectangular cross-section taken on a plane parallel to the XZ plane, the aspect ratio ($L_{30}/\phi_{30}$) is large. Connection terminals that can properly be used in a narrow-pitch arrangement are thus provided. Further, the rectangular cross-section parallel to the XZ plane makes it possible to provide the surface 31y of a large area size, which comes in contact with an electrode pad of a semiconductor chip through solder when the semiconductor chip is mounted on the wiring substrate, thereby providing a connection terminal having high connection reliability. The structure of the wiring substrate of the second embodiment has been described above.

Method of Making Wiring Substrate of Second Embodiment

In the following, a description will be given of a method of making a wiring substrate of the second embodiment. FIGS. 32 through 35 are drawings illustrating examples of process steps for making a wiring substrate according to the second embodiment. In FIGS. 32 through 35, the same elements as those of FIG. 31 are referred to by the same numerals, and a description thereof may be omitted.

First, the process steps the same as those illustrated in FIGS. 16 through 21 used in the first embodiment are performed. In the process step illustrated in FIG. 32, electrolytic plating that utilizes the support member 21 and the first metal layer 23 as power feeding layers for electroplating is performed to form the second metal layer 11a and the protruding metal layer 31 stacked in this order in the openings 23x. The second metal layer 11a is formed to cover the surface 21a of the support member 21 exposed through the openings 23x and to cover or coat the inner wall surfaces of the openings 23x. The protruding metal layer 31 is formed on the second metal layer 11a to at least fully fill the openings 23x.

The second metal layer 11a is made of a material that is not removable by an etching solution that removes the support member 21 and the first metal layer 23 in the process step illustrated in FIG. 34, which will be described later. Further, the second metal layer 11a is made of a material that can be selectively etched relative to the protruding metal layer 31 in the process step illustrated in FIG. 35, which will be described later. When Cu is used to form the support member 21, the first metal layer 23, and the protruding metal layer 31, for example, Ni may be used to form the second metal layer 11a.

Figure 33:
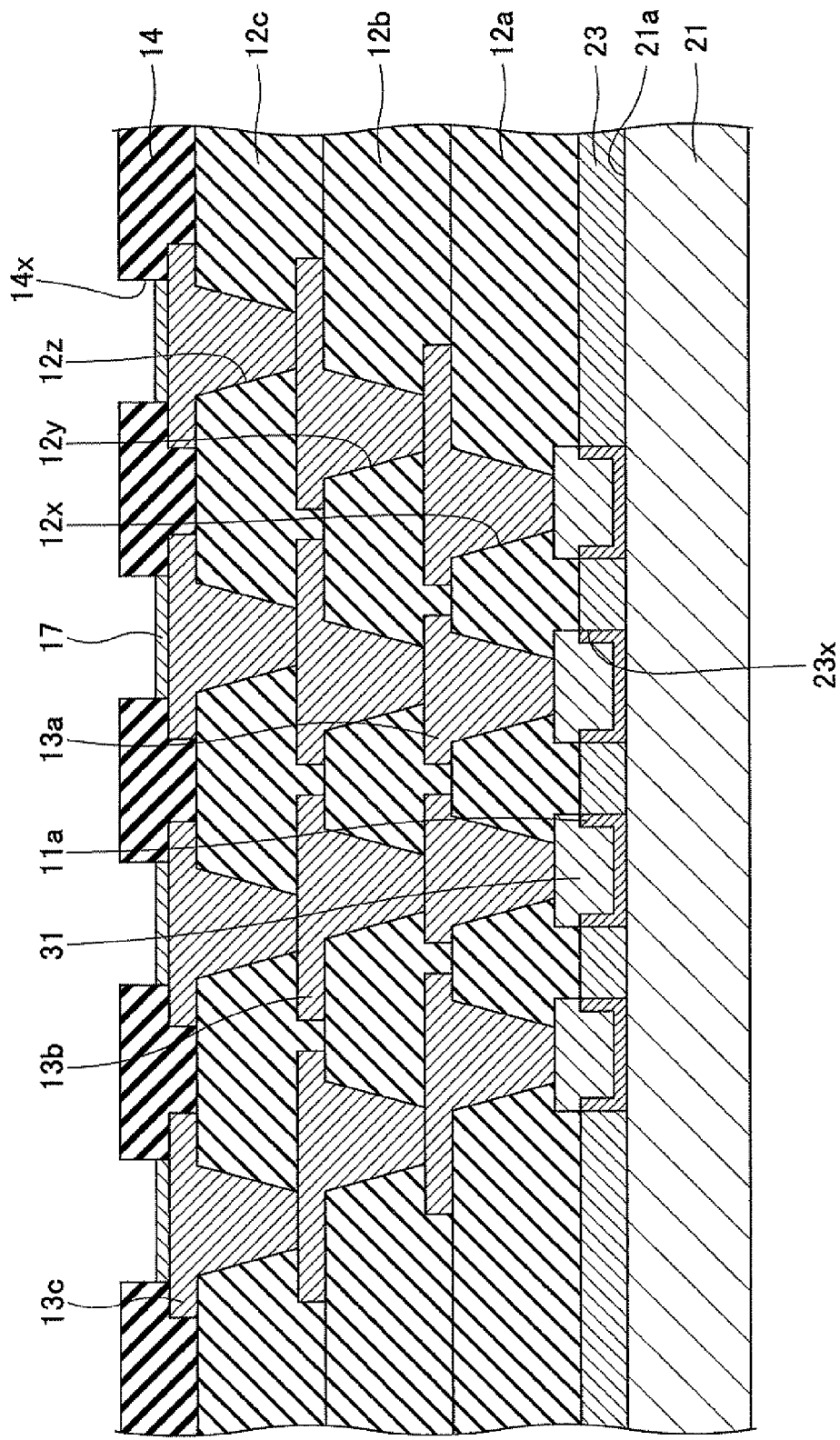
FIG. 33 is a drawing (part 2) illustrating an example of a process step of making the wiring substrate according to the second embodiment.

Next, the process steps which are the same as those illustrated in FIGS. 23 through 29 used in the first embodiment are performed to produce a structure illustrated in FIG. 33. In the process step illustrated in FIG. 34, the support member 21 and the first metal layer 23 illustrated in FIG. 33 are removed to cause the second metal layer 11a and at least a part of the protruding metal layer 31 to protrude from the first insulating layer 12a. A protrusion length $L_{31}$ of the second metal layer 11a and the protruding part of the protruding metal layer 31 protruding from the first insulating layer 12a corresponds to the thickness $T_{10}$ of the first metal layer 23 illustrated in FIG. 19, and is 30 to 50 μm, for example.

In the case that both the support member 21 and the first metal layer 23 are made of Cu, the support member 21 and the first metal layer 23 are removable by the same etching solution. For example, wet etching using aqueous ferric chloride, aqueous copper chloride, aqueous ammonium persulfate, or the like may be performed to remove the support member and the first metal layer 23. Since the second metal layer 11a is made of a material (e.g., Ni) that is not removable by an etching solution for removing the support member 21 and the first metal layer 23, the support member 21 and the first metal layer 23 can be selectively removed by etching without removing the second metal layer 11a.

Figure 34:
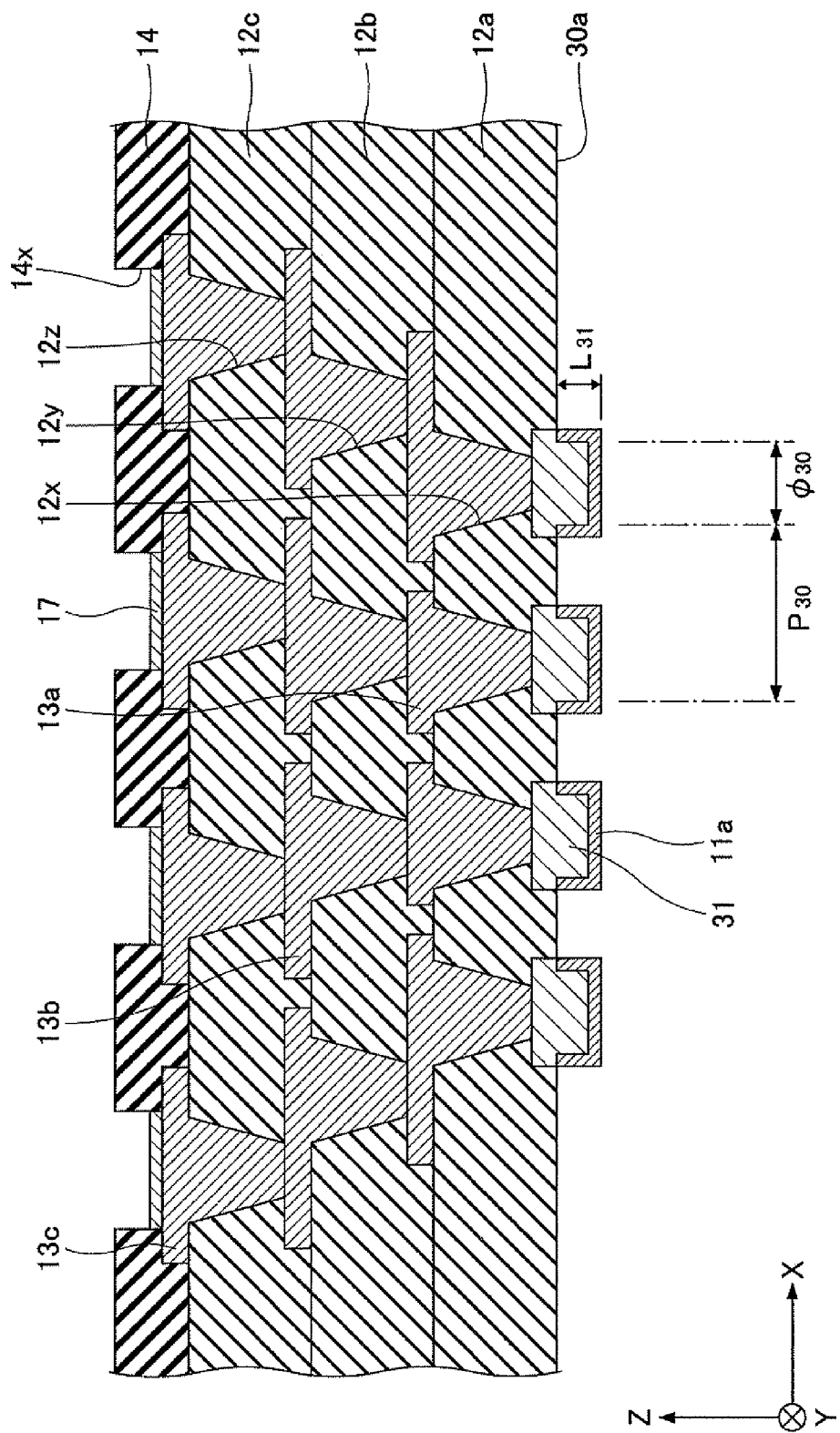
FIG. 34 is a drawing (part 3) illustrating an example of a process step of making the wiring substrate according to the second embodiment.
Figure 35:
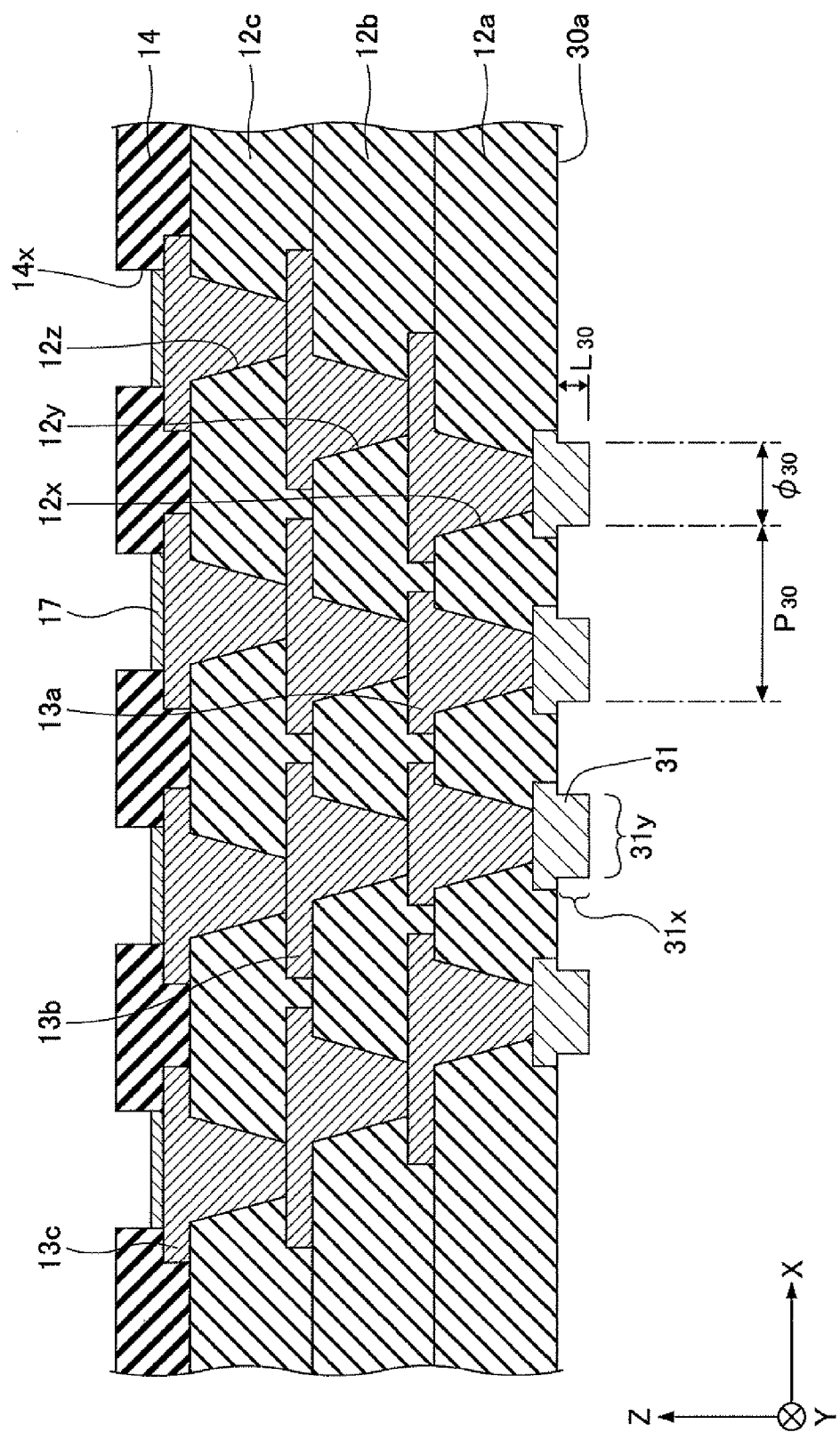
FIG. 35 is a drawing (part 4) illustrating an example of a process step of making the wiring substrate according to the second embodiment.

In the process step illustrated in FIG. 35, the second metal layer 11a illustrated in FIG. 34 is removed. Since the second metal layer 11a is made of a material (e.g. Ni) that can be selectively etched relative to the protruding metal layer 31 (e.g., Cu), the second metal layer 11a can be selectively removed by etching without removing the protruding metal layer 31. As a result, part of the protruding metal layer 31 protrudes from the first insulating layer 12a. The thickness of the second metal layer 11a is a few micrometers, so that the protrusion length $L_{30}$ of the protruding part 31x is approximately equal to the protrusion length $L_{30}$ illustrated in FIG. 34, and is approximately 30 to 50 μm, for example.

When the protruding metal layer 31 is Cu and the second metal layer 11a is Ni, for example, wet etching employing a nickel remover may be performed to selectively remove only the second metal layer 11a. A commercially available nickel remover such as EBASTRIP manufactured by EBARA-UDYLITE CO., LTD., MELSTRIP manufactured by Meltex Inc., or MEC REMOVER manufactured by MEC CO., LTD may be used.

Solder bumps 35 are then formed to cover the protruding metal layer 31, thereby forming the wiring substrate 30 illustrated in FIG. 31. Specifically, solder paste is printed to cover the protruding part 31x of the protruding metal layer 31, followed by performing a reflow process to form the solder bumps 35, for example. An alloy including Pb, an alloy of Sn and Cu, an alloy of Sn and Ag, or an alloy of Sn, Ag, and Cu may be used as a material to form the solder bump 35. The protruding metal layer 31 and the solder bumps 35 constitute the connection terminals 36, which are used for connection with a semiconductor chip.

The solder bumps 35 may not be formed on the wiring substrate 30. For example, solder bumps may be formed on electrode pads of a semiconductor chip that is to be mounted on the wiring substrate 30. These solder bumps formed on the semiconductor chip and the protruding part 31x of the protruding metal layer 31 of the wiring substrate 30 may be electrically connected. The method of forming a wiring substrate of the second embodiment has been described above.

According to the second embodiment, an opening for forming a protruding metal layer is not formed by etching as in the related-art methods, but is formed by plating. Because of this, the shape of the part (i.e., protruding part) of the protruding metal layer that protrudes from the surface of the wiring substrate is made into a columnar shape. That is, the cross-section of the protruding part has a rectangular shape rather than a round shape. As a result, the aspect ratio of the protruding part of the protruding metal layer is increased. Connection terminals that can properly be used in a narrow-pitch arrangement are thus provided. Further, it is possible to provide the protruding part of the protruding metal layer with a surface of a large area size, which comes in contact with an electrode pad of a semiconductor chip through solder when the semiconductor chip is mounted on the wiring substrate, thereby providing a connection terminal having high connection reliability.

Third Embodiment

The third embodiment is directed to another example of a wiring substrate having a multilayer interconnection structure (i.e., having buildup interconnection layers). In respect of the third embodiment, a description may be omitted for those parts which are in common with the first embodiment, and those parts which differ from the first embodiment will mainly be described.

Structure of Wiring Substrate of Third Embodiment

Figure 36:
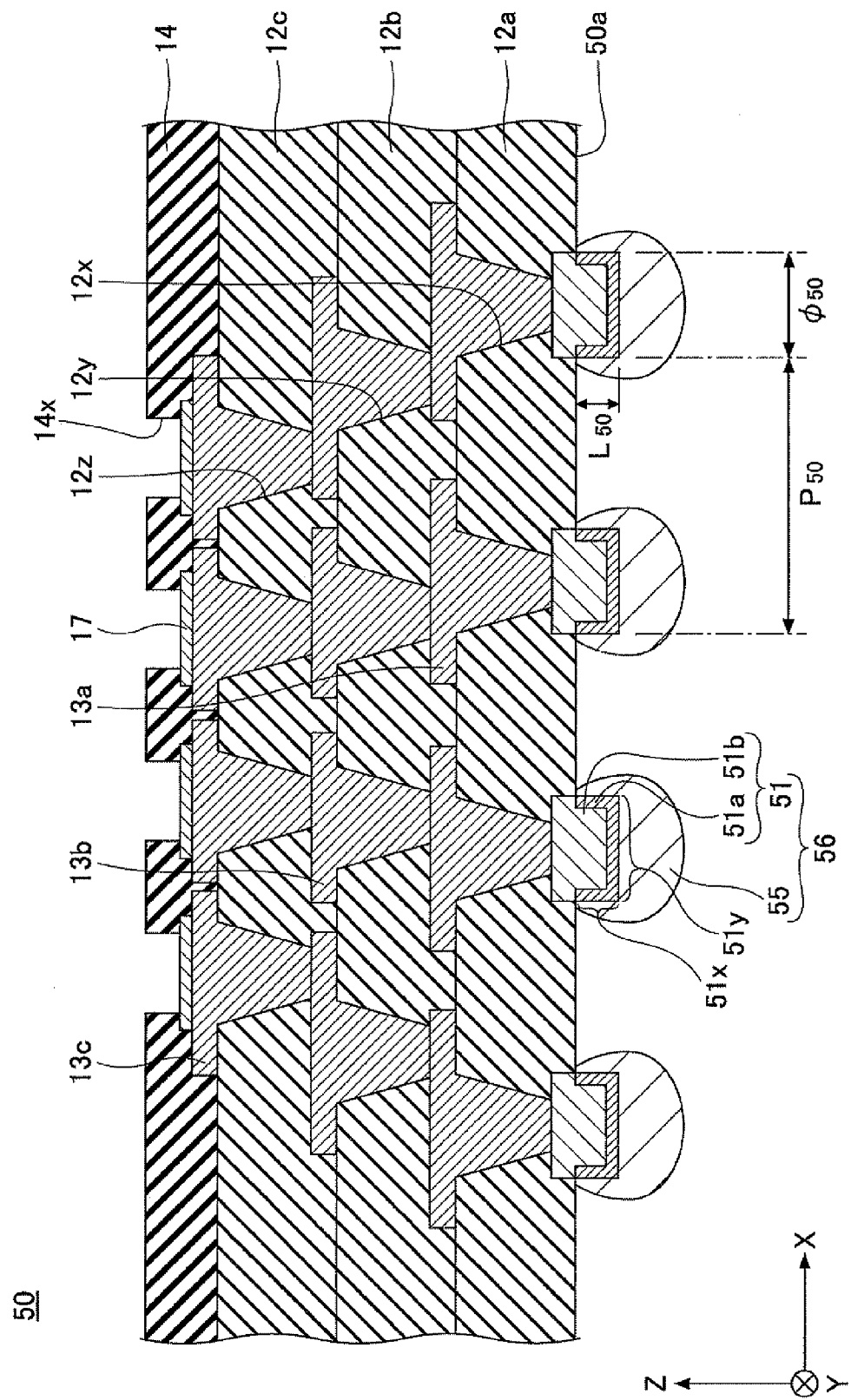
FIG. 36 is a cross-sectional view illustrating an example of a wiring substrate according to the third embodiment.

In the following, a description will be first given of the configuration of a wiring substrate of the third embodiment. FIG. 36 is a cross-sectional view illustrating an example of a wiring substrate according to the third embodiment. In FIG. 36, a wiring substrate 50 has buildup interconnection layers, and includes a first insulating layer 12a, a second insulating layer 12b, a third insulating layer 12c, a first interconnection layer 13a, a second interconnection layer 13b, a third interconnection layer 13c, a solder resist layer 14, connection terminals 56, and a fourth metal layer 17.

Unlike the wiring substrate 10, a chip mount surface of the wiring substrate 50 is the side on which the fourth metal layer 17 is formed. The fourth metal layer 17 serves as connection terminals for connection to the semiconductor chip. Pitches between the portions of the fourth metal layer 17 are designed to correspond to the pitches (e.g., 150 μm) of electrode pads formed on the semiconductor chip that is to be mounted. The connection terminals are used for connection with a mother board or the like. A pitch $P_{50}$ of the connection terminals 56 is formed wider than the pitch of the portions of the fourth metal layer 17 in order to match a pitch between connection terminals on the mother board or the like.

The connection terminals 56 are formed on a surface 50a of the wiring substrate 50. Each of the connection terminals 56 includes a protruding metal layer 51 partly protruding from the surface 50a of the wiring substrate 50 and a solder bump 55 formed to cover the protruding part of the protruding metal layer 51 protruding from the surface 50a of the wiring substrate 50. The protruding portion of the protruding metal layer 51 that protrudes from the surface 50a of the wiring substrate 50 may hereinafter be referred to as a protruding part 51x for the sake of convenience. Further, a surface of the protruding metal layer 51 opposite the surface in contact with the first insulating layer 12a may be referred to as a surface 51y. The surface 51y is to come in contact with an electrode pad of a mother board or the like through the solder when the wiring substrate 50 and the mother board or the like are connected to each other.

In the wiring substrate 50, the protruding part 51x has a rectangular cross-section taken on a plane parallel to the XZ plane, being different from the round shape of the related-art protruding metal layer. The protruding part 51x has a protrusion length $L_{50}$ protruding from the surface 50a of the wiring substrate 50, which is 30 to 50 μm, for example. The shape of the protruding part 51x may be a circular column, with a diameter $\phi_{50}$ of the surface 51y being 100 to 200 μm, for example. A pitch $P_{50}$ of the protruding part 51x may be 500 μm, for example. The shape of the protruding part 51x is not limited to a circular column, and may generally be columnar. Namely, the shape of the protruding part 51x may not be a circular column, but may be an ellipsoidal column or a prismatic column such as a rectangular column or a hexagonal column.

The protruding metal layer 51 includes a second metal layer 51a and a third metal layer 51b. The structure of the protruding metal layer 51 is such that the surface of the columnar third metal layer 51b is coated with the second metal layer 51a. The material of the second metal layer 51a may be Au, for example. The second metal layer 51a may be formed as an Ni and Au layer having an Ni layer and an Au layer stacked in this order on the third metal layer 51b, or may be formed as an Ni, Pd, and Au layer having an Ni layer, a Pd layer, and an Au layer stacked in this order on the third metal layer 51b. The material of the third metal layer 51b may be Cu, for example. An alloy including Pb, an alloy of Sn and Cu, an alloy of Sn and Ag, or an alloy of Sn, Ag, and Cu may be used as a material to form the solder bump 55.

The remaining structure of the wiring substrate 50 is the same as the structure of the wiring substrate 10, and a description thereof will be omitted. The method of forming the wiring substrate 50 is the same as the method of forming the wiring substrate 10, and a description thereof will be omitted.

According to the third embodiment, an opening for forming a protruding metal layer is not formed by etching as in the related-art methods, but is formed by plating. Because of this, the shape of the part (i.e., protruding part) of the protruding metal layer that protrudes from the surface of the wiring substrate is made into a columnar shape. That is, the cross-section of the protruding part has a rectangular shape rather than a round shape. Further, it is possible to provide the protruding metal layer with a surface of a large area size, which comes in contact with an electrode pad of a mother board or the like through solder when connected to the mother board or the like, thereby providing a connection terminal having high connection reliability.

Fourth Embodiment

The fourth embodiment is directed to another example of a wiring substrate having a multilayer interconnection structure (i.e., having buildup interconnection layers). In respect of the fourth embodiment, a description may be omitted for those parts which are in common with the second embodiment, and those parts which differ from the second embodiment will mainly be described.

Structure of Wiring Substrate of Fourth Embodiment

In the following, a description will be first given of the configuration of a wiring substrate of the fourth embodiment.

Figure 37:
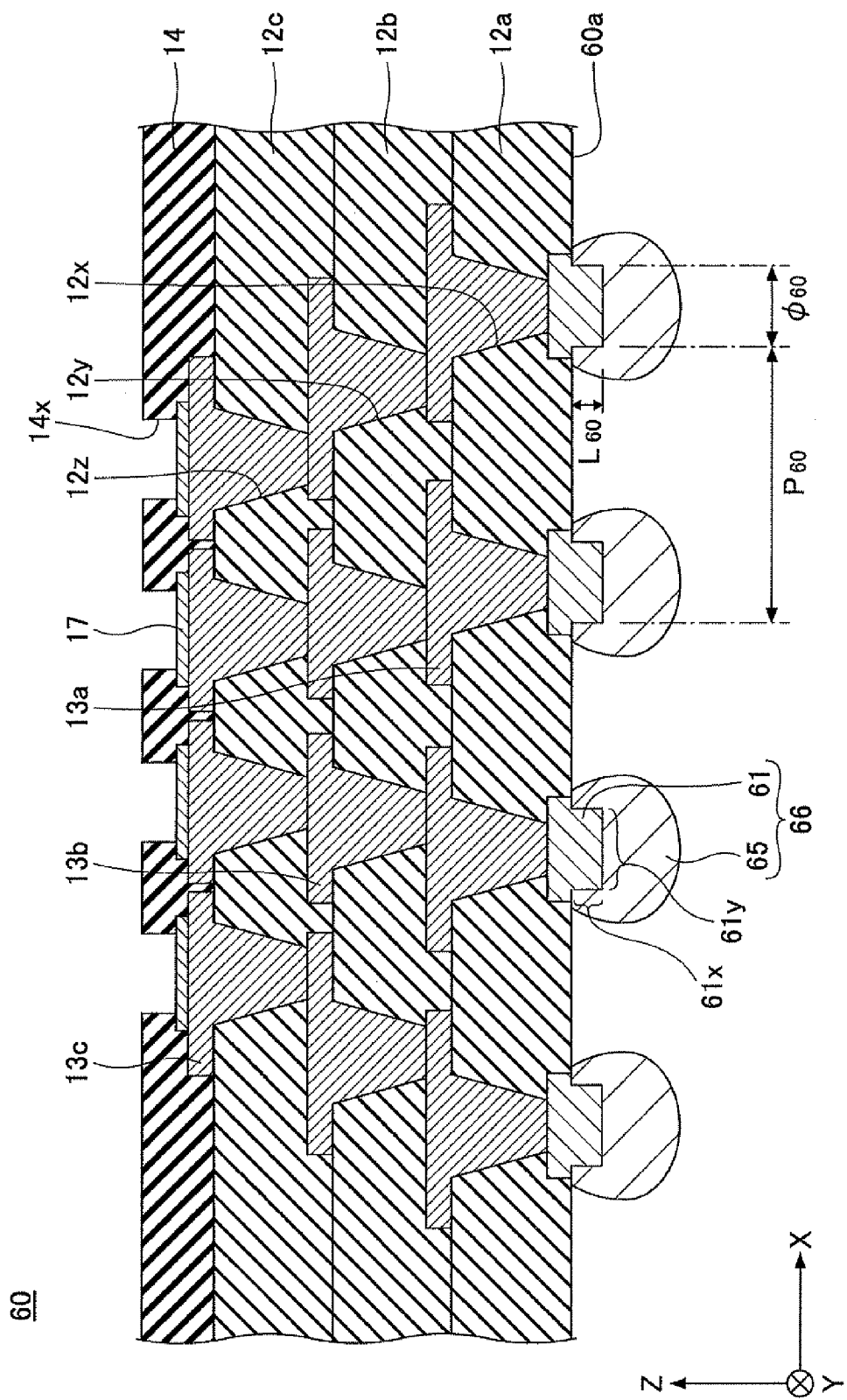
FIG. 37 is a cross-sectional view illustrating an example of a wiring substrate according to the fourth embodiment.

FIG. 37 is a cross-sectional view illustrating an example of a wiring substrate according to the fourth embodiment. In FIG. 37, a wiring substrate 60 has buildup interconnection layers, and includes a first insulating layer 12a, a second insulating layer 12b, a third insulating layer 12c, a first interconnection layer 13a, a second interconnection layer 13b, a third interconnection layer 13c, a solder resist layer 14, connection terminals 66, and a fourth metal layer 17.

Unlike the wiring substrate 30, a chip mount surface of the wiring substrate 60 is the side on which the fourth metal layer 17 is formed. The fourth metal layer 17 serves as connection terminals for connection to the semiconductor chip. Pitches between the portions of the fourth metal layer 17 are designed to correspond to the pitches (e.g., 150 μm) of electrode pads formed on the semiconductor chip that is to be mounted. The connection terminals are used for connection with a mother board or the like. A pitch $P_{60}$ of the connection terminals 66 is formed wider than the pitch of the portions of the fourth metal layer 17 in order to match a pitch between connection terminals on the mother board or the like.

The connection terminals 66 are formed on a surface 60a of the wiring substrate 60. Each of the connection terminals 66 includes a protruding metal layer 61 partly protruding from the surface 60a of the wiring substrate 60 and a solder bump 65 formed to cover the protruding part of the protruding metal layer 61 protruding from the surface 60a of the wiring substrate 60. The protruding portion of the protruding metal layer 61 that protrudes from the surface 60a of the wiring substrate 60 may hereinafter be referred to as a protruding part 61x for the sake of convenience. Further, a surface of the protruding metal layer 61 opposite the surface in contact with the first insulating layer 12a may be referred to as a surface 61y. The surface 61y is to come in contact with an electrode pad of a mother board or the like through the solder when the wiring substrate 60 and the mother board or the like are connected to each other.

In the wiring substrate 60, the protruding part 61x has a rectangular cross-section taken on a plane parallel to the XZ plane, being different from the round shape of the related-art protruding metal layer. The protruding part 61x has a protrusion length $L_{60}$ protruding from the surface 60a of the wiring substrate 60, which is 30 to 50 μm, for example. The shape of the protruding part 61x may be a circular column, with a diameter $\phi_{60}$ of the surface 61y being 100 to 200 μm, for example. A pitch $P_{60}$ of the protruding part 61x may be 500 μm, for example. The shape of the protruding part 61x is not limited to a circular column, and may generally be columnar. Namely, the shape of the protruding part 61x may not be a circular column, but may be an ellipsoidal column or a prismatic column such as a rectangular column or a hexagonal column.

Cu or the like may be used as the material of the protruding metal layer 61. An alloy including Pb, an alloy of Sn and Cu, an alloy of Sn and Ag, or an alloy of Sn, Ag, and Cu may be used as a material to form the solder bump 65.

The remaining structure of the wiring substrate 60 is the same as the structure of the wiring substrate 30, and a description thereof will be omitted. The method of forming the wiring substrate 60 is the same as the method of forming the wiring substrate 30, and a description thereof will be omitted.

According to the fourth embodiment, an opening for forming a protruding metal layer is not formed by etching as in the related-art methods, but is formed by plating. Because of this, the shape of the part (i.e., protruding part) of the protruding metal layer that protrudes from the surface of the wiring substrate is made into a columnar shape. That is, the cross-section of the protruding part has a rectangular shape rather than a round shape. Further, it is possible to provide the protruding metal layer with a surface of a large area size, which comes in contact with an electrode pad of a mother board or the like through solder when connected to the mother board or the like, thereby providing a connection terminal having high connection reliability.

Fifth Embodiment

The fifth embodiment is directed to an example of a semiconductor package in which a semiconductor chip is mounted on a wiring substrate having buildup interconnection layers. In respect of the fifth embodiment, a description may be omitted for those parts which are in common with the first embodiment, and those parts which differ from the first embodiment will mainly be described.

Structure of Semiconductor Package of Fifth Embodiment

Figure 38:
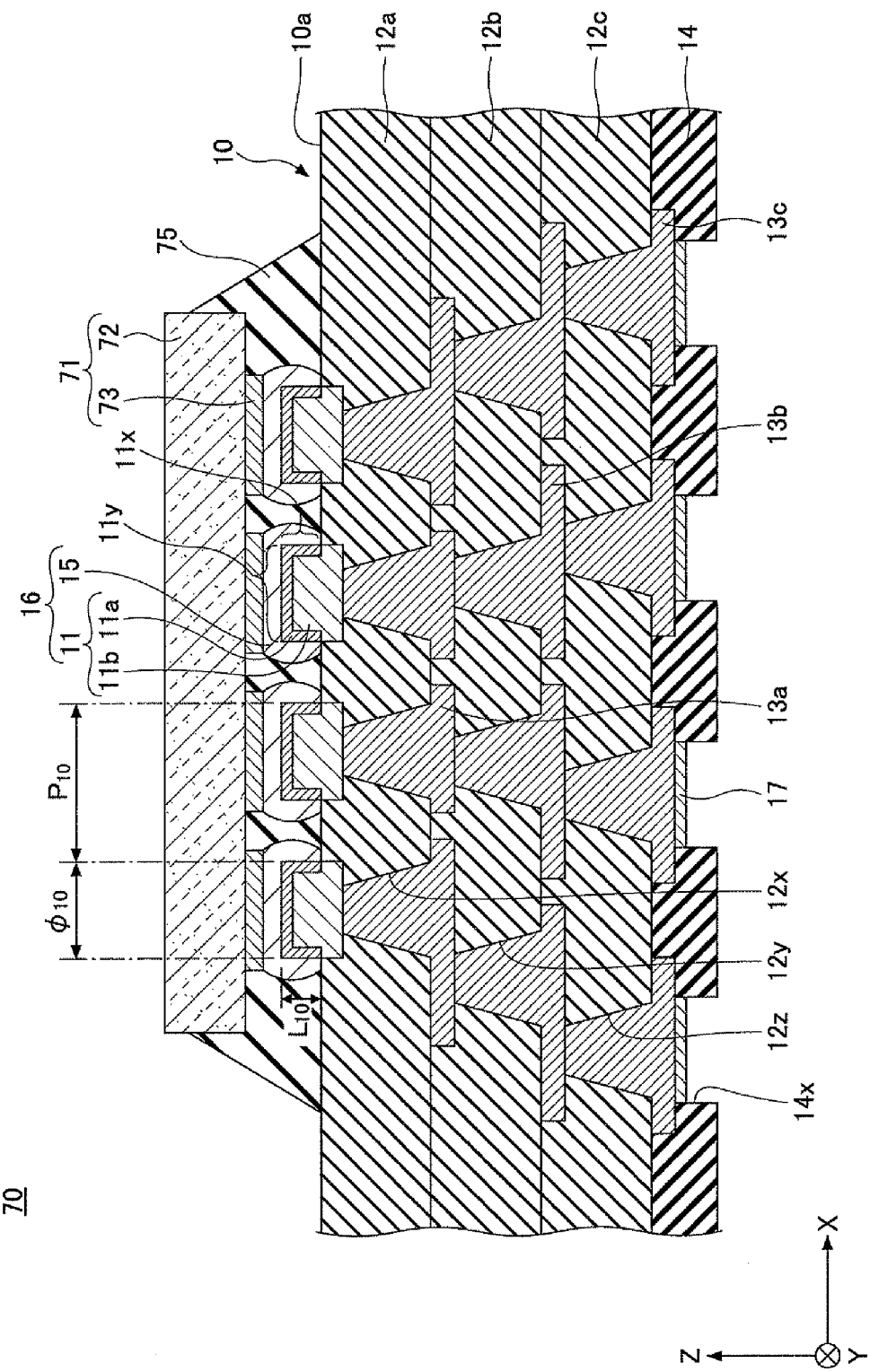
FIG. 38 is a cross-sectional view illustrating an example of a semiconductor package according to the fifth embodiment.

In the following, a description will be first given of the configuration of a semiconductor package of the fifth embodiment. FIG. 38 is a cross-sectional view illustrating an example of a semiconductor package according to the fifth embodiment. In FIG. 38, the same elements as those of FIG. 15 are referred to by the same numerals, and a description thereof may be omitted. In FIG. 38, a semiconductor package 70 includes a wiring substrate 10 illustrated in FIG. 15, a semiconductor chip 71, and an underfill resin 75.

The semiconductor chip 71 includes a chip and electrode pads 73. The chip 72 has a semiconductor integrated circuit (not shown) formed on a semiconductor substrate (not shown) that is a thin plate made of silicon or the like. The electrode pads 73 are formed on the chip 72. The electrode pads 73 are electrically connected to the semiconductor integrated circuit (not shown). Au or the like may be used as the material of the electrode pads 73. The solder bumps 15 of the wiring substrate 10 are electrically connected to the electrode pads 73 of the semiconductor chip 71 upon being melted. The underfill resin 75 fills the gap between the semiconductor chip 71 and the surface 10*a* of the wiring substrate 10.

Since the cross-section of the protruding part 11*x* of the wiring substrate 10 is rectangular, the area size of the surface fly that opposes the electrode pads 73 across the melted solder bumps 15 is increased. Connection terminals having high connection reliability are thus provided. The structure of the semiconductor package of the fifth embodiment has been described above.

Method of Making Semiconductor Package of Fifth Embodiment

Figure 39:
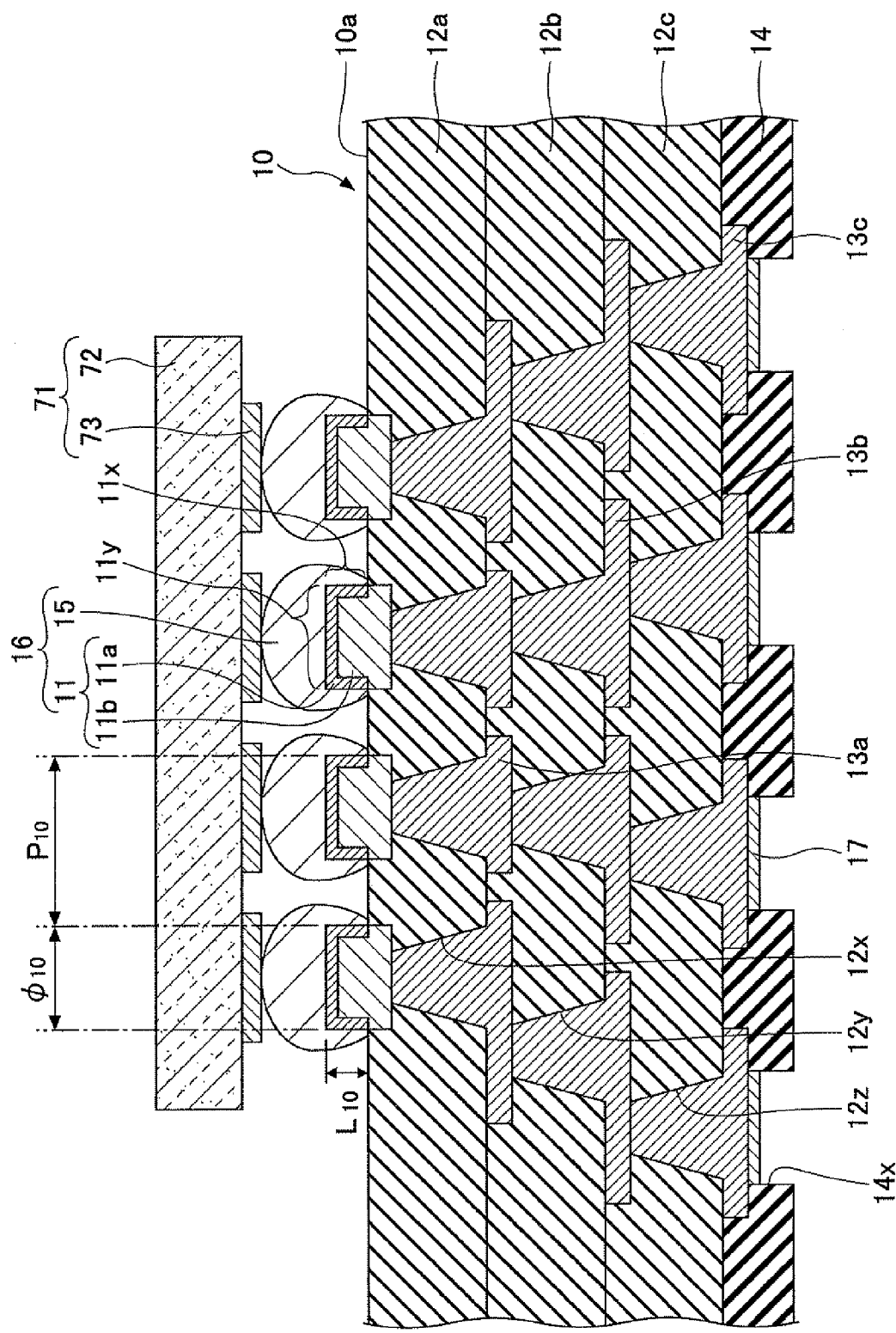
FIG. 39 is a drawing (part 1) illustrating an example of a process step of making the semiconductor package according to the fifth embodiment.
Figure 40:
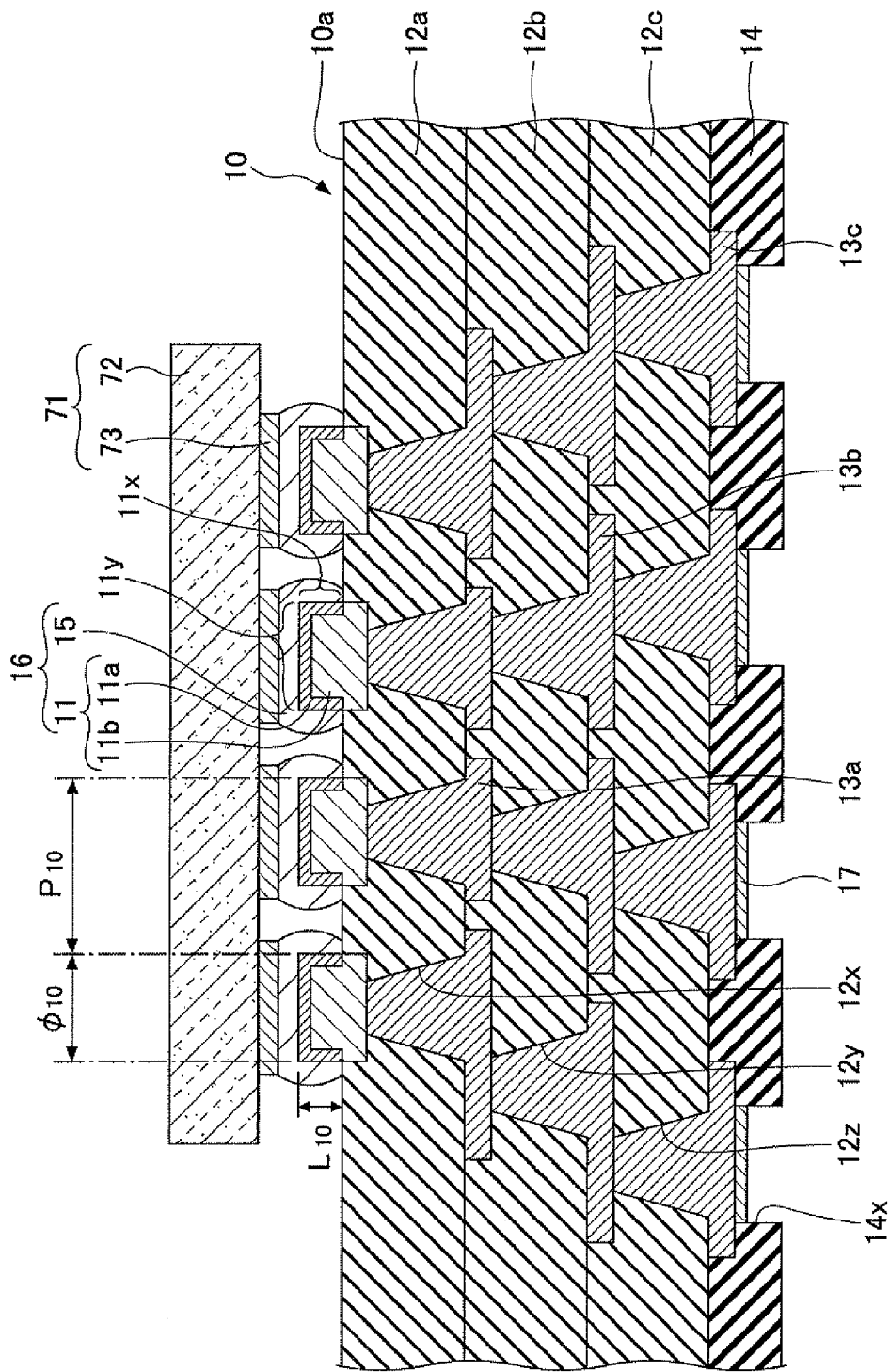
FIG. 40 is a drawing (part 2) illustrating an example of a process step of making the semiconductor package according to the fifth embodiment.

In the following, a description will be given of a method of making a semiconductor package of the fifth embodiment. FIGS. 39 and 40 are drawings illustrating examples of process steps for making a semiconductor package according to the fifth embodiment. In FIGS. 39 and 40, the same elements as those of FIG. 38 are referred to by the same numerals, and a description thereof may be omitted.

First, the wiring substrate 10 illustrated in FIG. 15 is provided. In the process step illustrated in FIG. 39, the wiring substrate 10 and the semiconductor chip 71 are arranged, such that the surface of the wiring substrate 10 on which the connection terminals 16 are formed are opposed to the surface of the semiconductor chip 71 on which the electrode pads 73 are formed, and such that the connection terminals 16 and the electrode pads 73 are positioned to face each other.

In the process step illustrated in FIG. 40, the solder bumps 15 of the connection terminals 16 are heated to 230 degrees Celsius, for example, to melt the solder. As a result, the protruding metal layer 11 of the connection terminals 16 is electrically connected to the electrode pads 73. If solder is formed on each of the electrode pads 73, the solder on each electrode pad 73 and each solder bump 15 are melted into one bump. After this, the underfill resin 75 is injected to fill the gap between the semiconductor chip 71 and the surface 10*a* of the wiring substrate 10, thereby completing the semiconductor package 70 illustrated in FIG. 38.

According to the fifth embodiment, a semiconductor package is manufactured that has a semiconductor chip mounted on a wiring substrate via connection terminals or the like. In this configuration, the connection terminals of the wiring substrate have a columnar protruding part, with the cross-section thereof having a rectangular shape rather than a round shape. Because of this, it is possible to provide the protruding part with a surface of a large area size, which comes in contact with an electrode pad of a semiconductor chip through solder, thereby improving connection reliability between the wiring substrate and the semiconductor chip in the semiconductor package.

Sixth Embodiment

The sixth embodiment is directed to another example of a semiconductor package in which a semiconductor chip is mounted on a wiring substrate having buildup interconnection layers. In respect of the sixth embodiment, a description may be omitted for those parts which are in common with the second embodiment, and those parts which differ from the second embodiment will mainly be described.

Structure of Semiconductor Package of Sixth Embodiment

Figure 41:
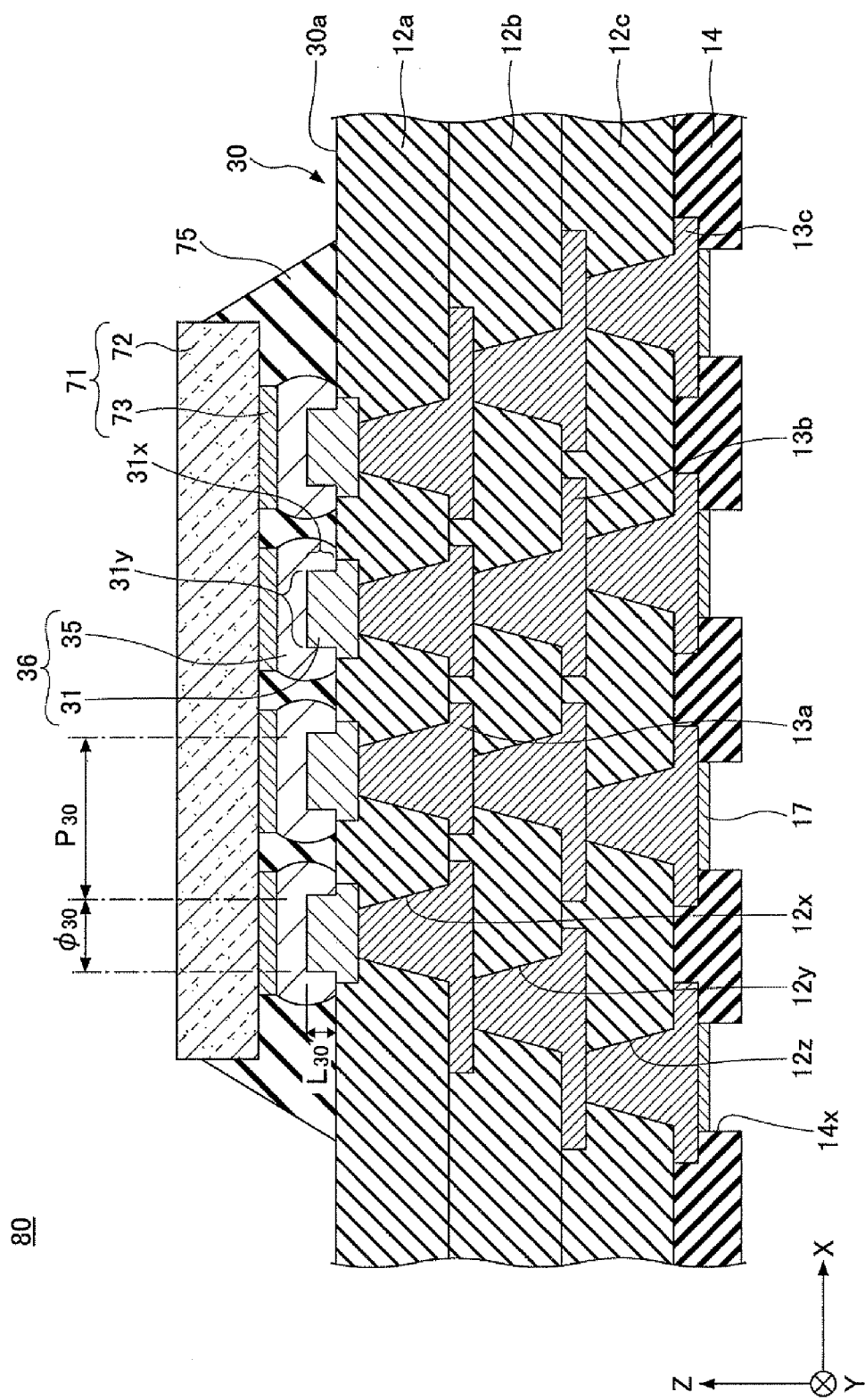
FIG. 41 is a cross-sectional view illustrating an example of a semiconductor package according to the sixth embodiment.

In the following, a description will be first given of the configuration of a semiconductor package of the sixth embodiment. FIG. 41 is a cross-sectional view illustrating an example of a semiconductor package according to the sixth embodiment. In FIG. 41, the same elements as those of FIG. 31 are referred to by the same numerals, and a description thereof may be omitted. In FIG. 41, a semiconductor package 80 includes a wiring substrate 30 illustrated in FIG. 31, a semiconductor chip 71, and an underfill resin 75.

The semiconductor chip 71 includes a chip and electrode pads 73. The chip 72 has a semiconductor integrated circuit (not shown) formed on a semiconductor substrate (not shown) that is a thin plate made of silicon or the like. The electrode pads 73 are formed on the chip 72. The electrode pads 73 are electrically connected to the semiconductor integrated circuit (not shown). Au or the like may be used as the material of the electrode pads 73. The solder bumps 35 of the wiring substrate 30 are electrically connected to the electrode pads 73 of the semiconductor chip 71 upon being melted. The underfill resin 75 fills the gap between the semiconductor chip 71 and the surface 30*a* of the wiring substrate 30.

Since the cross-section of the protruding part 31*x* of the wiring substrate 30 is rectangular, the area size of the surface 31*y* that opposes the electrode pads 73 across the melted solder bumps 35 is increased. Connection terminals having high connection reliability are thus provided. The structure of the semiconductor package of the sixth embodiment has been described above. The method of making the semiconductor package of the sixth embodiment is similar to the method of making the semiconductor package of the fifth embodiment, and a description thereof will be omitted.

According to the sixth embodiment, a semiconductor package is manufactured that has a semiconductor chip mounted on a wiring substrate via connection terminals or the like. In this configuration, the connection terminals of the wiring substrate have a columnar protruding part, with the cross-section thereof having a rectangular shape rather than a round shape. Because of this, it is possible to provide the protruding part with a surface of a large area size, which comes in contact with an electrode pad of a semiconductor chip through solder, thereby improving connection reliability between the wiring substrate and the semiconductor chip in the semiconductor package.

Further, the present invention is not limited to these embodiments, but various variations and modifications may be made without departing from the scope of the present invention.

For example, the above-described embodiments have been directed to examples in which interconnection layers are formed by use of a semi-additive method. This is not a limiting example, and interconnection layers may be formed by a different method such as a subtractive method or the like. Further, in the above-described embodiments, the protruding metal layer 11, 31, 51, or 61 may alone form the connection terminals 16, 36, 56, or 66 without the provision of the bumps 15, 35, 55, or 65, respectively.

The present application is based on Japanese priority application No. 2009-099989 filed on Apr. 16, 2009, with the Japanese Patent Office, the entire contents of which are hereby incorporated by reference.

What is claimed is:

1. A method of making a wiring substrate having at least one interconnection layer, comprising:
    a first metal layer forming step of forming a first metal layer on a surface of a support member, the first metal layer having at least one colmmnar through hole that exposes part of the surface of the support member;
    a columnar metal layer forming step of forming a columnar metal layer that fills the columnar through hole;
    an insulating layer forming step of forming an insulating layer on the columnar metal layer and on the first metal layer;
    an interconnection layer forming step of forming an interconnection layer on a first surface of the insulating layer such that the interconnection layer is electrically connected to the columnar metal layer through the insulating layer; and
    a protruding part forming step of forming, by removing at least an entirety of the support member and an entirety of the first metal layer, a protruding part including at least part of the columnar metal layer protruding from a second surface of the insulating layer opposite the first surface, the protruding part serving as at least part of a connection terminal of the wiring substrate.

2. The method as claimed in claim 1, wherein the columnar metal layer forming step includes the steps of
    a second metal layer forming step of forming a second metal layer that coats both the surface of the support member exposed through the columnar through hole and an inner wall surface of the columnar through hole; and
    a third metal layer forming step of forming a third metal layer on the second metal layer to fill the columnar through hole coated with the second metal layer, the second metal layer and the third metal layer together constituting the columnar metal layer.

3. The method as claimed in claim 2, wherein the protruding part includes the second metal layer and the third metal layer.

4. The method as claimed in claim 2, wherein the protruding part forming step removes the second metal layer after removing the support member and the first metal layer, thereby to form the protruding part including the third metal layer.

5. The method as claimed in claim 1, wherein a cross-sectional shape of the columnar through hole taken on a plane perpendicular to a longitudinal direction thereof is substantially constant through an entire length of the columnar through hole.

6. The method as claimed in claim 1, wherein the first metal layer forming step includes:
    forming a columnar resist layer having a shape matching the columnar through hole on the support member;
    forming the first metal layer on the support member in areas where the columnar resist layer is not formed; and
    removing the columnar resist layer.

7. The method as claimed in claim 1, wherein the support member is an electrical conductor, and the first metal layer forming step forms the first metal layer by an electroplating method using the support member as a power feeding layer.

8. The method as claimed in claim 1, wherein the support member is an electrical conductor, and the columnar metal layer forming step forms the columnar metal layer by an electroplating method using the support member as a power feeding layer.

9. The method as claimed in claim 1, wherein the support member and the first metal layer are made of one or more materials that are simultaneously removable by a common etching solution.

10. The method as claimed in claim 2, wherein the second metal layer is made of a material that is not removable by an etching solution that removes the support member and the first metal layer.

11. The method as claimed in claim 2, wherein the second metal layer has a structure in which plural metal layers made of different materials are stacked one over another.

12. A method of making a semiconductor package, comprising:
    providing the wiring substrate having the protruding part made by the method of claim 1 and a semiconductor chip having at least one electrode pad;
    arranging the semiconductor chip on the wiring substrate such that the electrode pad faces the protruding part; and
    electrically connecting the protruding part to the electrode pad.

13. The method as claimed in claim 12, further comprising providing resin that fills a gap between the semiconductor chip and the surface of the wiring substrate on which the protruding part is formed.

* * * * *